(12) United States Patent
Han et al.

(10) Patent No.: US 12,245,471 B2
(45) Date of Patent: Mar. 4, 2025

(54) DISPLAY SUBSTRATE AND DISPLAY DEVICE

(71) Applicant: BOE Technology Group Co., Ltd., Beijing (CN)

(72) Inventors: Ying Han, Beijing (CN); Yicheng Lin, Beijing (CN); Ling Wang, Beijing (CN); Guoying Wang, Beijing (CN); Xing Zhang, Beijing (CN); Zhan Gao, Beijing (CN); Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 455 days.

(21) Appl. No.: 17/788,387

(22) PCT Filed: Aug. 4, 2021

(86) PCT No.: PCT/CN2021/110600
§ 371 (c)(1),
(2) Date: Jun. 23, 2022

(87) PCT Pub. No.: WO2022/062695
PCT Pub. Date: Mar. 31, 2022

(65) Prior Publication Data
US 2023/0031110 A1  Feb. 2, 2023

(30) Foreign Application Priority Data

Sep. 24, 2020 (CN) .......................... 202011018998.X

(51) Int. Cl.
*H01L 27/14* (2006.01)
*H01L 27/12* (2006.01)
(Continued)

(52) U.S. Cl.
CPC .......... *H10K 59/13* (2023.02); *H01L 27/124* (2013.01); *H01L 27/1255* (2013.01);
(Continued)

(58) Field of Classification Search
CPC .. H10K 59/13; H10K 50/865; H10K 59/1213; H10K 59/1216; H10K 59/131;
(Continued)

(56) References Cited

U.S. PATENT DOCUMENTS 10,192,935 B2   1/2019 Shim et al.
2018/0061908 A1  3/2018 Shim et al.
(Continued)

FOREIGN PATENT DOCUMENTS

| CN | 107799556 A | 3/2018 |
| CN | 109950293 A | 6/2019 |
| CN | 111403455 A | 7/2020 |

*Primary Examiner* — Tan N Tran
(74) *Attorney, Agent, or Firm* — WHDA, LLP

(57) ABSTRACT

The display substrate includes: a substrate; a plurality of pixel units on the substrate, each pixel unit includes a plurality of sub-pixels, each sub-pixel includes a light-emitting element and a pixel drive circuit; a photosensitive circuit on the substrate; a first conductive film layer on the substrate. The pixel drive circuit includes a drive transistor, a gate electrode of the drive transistor is located on a side of a drive active layer away from the substrate, an orthographic projection of the gate electrode of the drive transistor on the substrate at least partially overlaps an orthographic projection of the drive active layer on the substrate. The first conductive film layer includes a first light-shielding portion between the substrate and the drive active layer, and an orthographic projection of the first light-shielding portion on the substrate at least partially overlaps the orthographic projection of the drive active layer on the substrate.

18 Claims, 20 Drawing Sheets

(51) Int. Cl.
  *H10K 50/86*   (2023.01)
  *H10K 59/121*  (2023.01)
  *H10K 59/13*   (2023.01)
  *H10K 59/131*  (2023.01)

(52) U.S. Cl.
  CPC ....... *H10K 50/865* (2023.02); *H10K 59/1213* (2023.02); *H10K 59/1216* (2023.02); *H10K 59/131* (2023.02)

(58) Field of Classification Search
  CPC ... H10K 59/60; H01L 27/124; H01L 27/1255; H01L 29/78633; G09G 3/3233
  USPC ..................................................... 257/59, 72
  See application file for complete search history.

(56) References Cited

U.S. PATENT DOCUMENTS

| | | |
|---|---|---|
| 2020/0119126 A1 | 4/2020 | Jo et al. |
| 2021/0384275 A1 | 12/2021 | Wang et al. |
| 2022/0320217 A1 | 10/2022 | Han et al. |

DISPLAY SUBSTRATE AND DISPLAY DEVICE

CROSS REFERENCE TO RELATED APPLICATION

This application is a Section 371 National Stage Application of International Application No. PCT/CN2021/110600, filed on Aug. 4, 2021, entitled "DISPLAY SUBSTRATE AND DISPLAY DEVICE", which is incorporated herein by reference in its entirety which claims priority to Chinese Application No. 202011018998.X, filed on Sep. 24, 2020, incorporated herein by reference in their entirety.

TECHNICAL FIELD

The present disclosure relates to a field of display technology, and in particular, to a display substrate and a display device.

BACKGROUND

Uniformity of light emission is one of important indicators to measure a quality of a display panel. In an existing display panel, there is a phenomenon that the display panel emits light unevenly, that is, poor uniformity of light emission. For example, in an OLED display panel, uncontrollable factors such as process instability, parameter drift, and device aging of TFT and OLED light-emitting devices lead to a change in OLED current, which may lead to uneven light emission of the display panel.

SUMMARY

In order to solve at least one aspect of the above-mentioned problem, embodiments of the present disclosure provide a display substrate and a display device.

In an aspect, there is provided a display substrate, including:

a substrate;

a plurality of pixel units disposed on the substrate, wherein each of the pixel units includes a plurality of sub-pixels, and each of the sub-pixels includes a light-emitting element and a pixel drive circuit for driving the light-emitting element;

a photosensitive circuit disposed on the substrate, wherein the photosensitive circuit is configured to sense light emitted by at least one of the pixel units; and a first conductive film layer disposed on the substrate, wherein the pixel drive circuit at least includes a drive transistor, the drive transistor is electrically connected to the light-emitting element, the drive transistor at least includes a drive active layer and a gate electrode, the gate electrode of the drive transistor is located in a side of the drive source layer away from the substrate, and an orthographic projection of the gate electrode of the drive transistor on the substrate at least partially overlaps with an orthographic projection of the drive active layer on the substrate;

wherein the first conductive film layer at least includes a first light shielding portion, the first light shielding portion is located between the substrate and the drive active layer, and an orthographic projection of the first light shielding portion on the substrate at least partially overlaps with the orthographic projection of the drive active layer on the substrate; and wherein the first light shielding portion is electrically connected to the gate electrode of the drive transistor.

According to some exemplary embodiments, the photosensitive circuit at least includes a photosensitive element and a control transistor, the control transistor is electrically connected to the photosensitive element, the control transistor at least includes a control active layer and a gate electrode, the gate electrode of the control transistor is located on a side of the control active layer away from the substrate, and an orthographic projection of the gate electrode of the control transistor on the substrate at least partially overlaps an orthographic projection of the control active layer on the substrate:

the first conductive film layer further includes a second light shielding portion, the second light shielding portion is located between the substrate and the control active layer, and an orthographic projection of the second light shielding portion on the substrate at least partially overlaps with the orthographic projection of the control active layer on the substrate; and the second light shielding portion is electrically connected to the gate electrode of the control transistor.

According to some exemplary embodiments, the control active layer and the drive active layer are both located in a same semiconductor film layer, and the gate electrode of the control transistor and the gate electrode of the drive transistor are both located in a same second conductive film layer.

According to some exemplary embodiments, the display substrate further includes a third conductive film layer disposed on a side of the second conductive film layer away from the substrate, the third conductive film layer at least includes a first power supply signal line, a first reference signal line, a data line and a first body portion, the first reference signal line is located between the first power supply signal line and the data line, and the first body portion is located between the first reference signal line and the data line; and the first light shielding portion is electrically connected to the first body portion, and the gate electrode of the drive transistor is electrically connected to the first body portion, so that the first light shielding portion is electrically connected to the gate electrode of the drive transistor.

According to some exemplary embodiments, the pixel drive circuit further includes a first switch transistor, the first switch transistor at least includes a first electrode and a second electrode, the first electrode of the first switch transistor is electrically connected to the data line, and the second electrode of the first switch transistor is electrically connected to the first body portion.

According to some exemplary embodiments, the first conductive film layer further includes a first conductive portion, and the first conductive portion and the first light shielding portion are integrally connected:

the display substrate further includes a first via hole exposing at least a part of the first conductive portion, and orthographic projections of the first body portion, the first via hole and the first conductive portion on the substrate at least partially overlap each other, so that the first conductive portion is electrically connected to the first body portion through the first via hole.

According to some exemplary embodiments, the display substrate further includes a second via hole exposing at least a part of the second electrode of the first switch transistor, orthographic projections of the first body portion, the second via hole and the second electrode of the first switch transistor on the substrate at least partially overlap each other, so that the first body portion is electrically connected to the second electrode of the first switch transistor through the second via hole.

According to some exemplary embodiments, the second conductive film layer includes a first scan signal line and a drive gate electrode portion, the first scan signal line is spaced apart from the drive gate electrode portion, and a part of the drive gate electrode portion overlapping the drive active layer forms the gate electrode of the drive transistor; and the display substrate further includes a third via hole exposing at least a part of the drive gate electrode portion, and orthographic projections of the drive gate electrode portion, the third via hole and the first body portion on the substrate at least partially overlap each other, so that the drive gate electrode portion is electrically connected to the first body portion through the third via hole.

According to some exemplary embodiments, the second conductive film layer further includes a second scan signal line and a second reference signal line, and a part of the second scan signal line overlapping the control active layer forms the gate electrode of the control transistor;

the display substrate further includes a first conductive via hole and a second conductive via hole, the first conductive via hole exposes at least a part of the second light shielding portion, and the second conductive via hole exposes at least a part of the second scan signal line;

the third conductive film layer further includes a first conductive connection portion, and orthographic projections of the first conductive connection portion, the first conductive via hole and the second light shielding portion on the substrate at least partially overlap each other, so that the second light shielding portion is electrically connected to an end of the first conductive connection portion through the first conductive via hole; and orthographic projections of the first conductive connection portion, the second conductive via hole, and the second scan signal line on the substrate at least partially overlap each other, so that the second scan signal line is electrically connected to the other end of the first conductive connection portion through the second conductive via hole.

According to some exemplary embodiments, the display substrate further includes a fourth conductive film layer disposed on a side of the third conductive film layer away from the substrate, and the fourth conductive film layer at least includes a second body portion; and an orthographic projection of the second body portion on the substrate at least partially overlaps with an orthographic projection of the drive transistor on the substrate, and the second body portion is electrically connected to the gate electrode of the drive transistor.

According to some exemplary embodiments, the pixel drive circuit further includes a second switch transistor, the second switch transistor at least includes a gate electrode, a first electrode and a second electrode, the gate electrode of the second switch transistor is electrically connected to the first scan signal line, the first electrode of the second switch transistor is electrically connected to the first reference signal line, and the second electrode of the second switch transistor is electrically connected to the light-emitting element;

the fourth conductive film layer at least includes a third body portion, the third body portion is spaced apart from the second body portion; and an orthographic projection of the third body portion on the substrate at least partially overlaps with an orthographic projection of a combination of the first switch transistor and the second switch transistor on the substrate, and the third body portion is electrically connected to the first scan signal line.

According to some exemplary embodiments, the second switch transistor further includes a second switch active layer, and the drive active layer and the second switch active layer are integrally connected.

According to some exemplary embodiments, the light-emitting element includes:

a first electrode;

a second electrode disposed on a side of the first electrode away from the substrate; and a light-emitting material layer sandwiched between the first electrode of the light-emitting element and the second electrode of the light-emitting element, wherein each of the drive transistor and the second switch transistor is electrically connected to the first electrode of the light-emitting element, and the first electrode of the light-emitting element is located on a side of the fourth conductive film layer away from the substrate; and orthographic projections of a combination of the drive active layer and the second switch active layer, the first light shielding portion, the first body portion, the second body portion and the first electrode on the substrate at least partially overlap each other.

According to some exemplary embodiments, the pixel drive circuit further includes a first storage capacitor;

a first capacitor is formed between the combination of the drive active layer and the second switch active layer and the first light shielding portion, a second capacitor is formed between the combination of the drive active layer and the second switch active layer and the first body portion, and a third capacitor is formed between the second body portion and the first electrode; and a capacitance value of the first storage capacitor is equal to a sum of capacitance values of the first capacitor, the second capacitor and the third capacitor.

According to some exemplary embodiments, the third conductive film layer further includes a first conductive body portion and a second conductive body portion, the first conductive body portion is spaced apart from the second conductive body portion, and the first conductive body portion and the second conductive body portion are respectively electrically connected to the second reference signal line.

According to some exemplary embodiments, the control transistor further includes a first electrode and a second electrode, and the third conductive film layer further includes a detection signal line;

the photosensitive element includes a first sensing electrode, a second sensing electrode, and a photosensitive layer disposed between the first sensing electrode and the second sensing electrode, and the second sensing electrode is located in the fourth conductive film layer; and the first electrode of the control transistor is electrically connected to the detection signal line, and the first electrode of the control transistor is electrically connected to the second sensing electrode.

According to some exemplary embodiments, the display substrate further includes a fifth conductive film layer disposed on a side of the fourth conductive film layer away from the substrate, the first sensing electrode is located in the fifth conductive film layer, and the first sensing electrode is electrically connected to the second reference signal line.

According to some exemplary embodiments, the photosensitive circuit further includes a second storage capacitor, and the second storage capacitor is connected in parallel with the photosensitive element;

orthographic projections of a combination of the first conductive body portion and the second conductive body portion, the second sensing electrode and the first sensing electrode on the substrate at least partially overlap each other; and a fourth capacitor is formed between the second sensing electrode and the combination of the first conductive body portion and the second conductive body portion, a fifth capacitor is formed between the second sensing electrode and the first sensing electrode, and a capacitance value of the second storage capacitor is equal to a sum of capacitance values of the fourth capacitor and the fifth capacitor.

According to some exemplary embodiments, at least two pixel units share a same photosensitive circuit.

According to some exemplary embodiments, the display substrate further includes a first sensing electrode lead-out portion, and the first sensing electrode lead-out portion and the first electrode of the light-emitting element are located on a same layer and spaced apart from each other: and the first sensing electrode is electrically connected to the second reference signal line through the first sensing electrode lead-out portion.

In another aspect, there is provided a display device including the above-mentioned display substrate.

BRIEF DESCRIPTION OF DRAWINGS

Other objects and advantages of the present disclosure will be clearer through the following description of the present disclosure with reference to the accompanying drawings, which may facilitate a comprehensive understanding of the present disclosure.

Figure 1A:
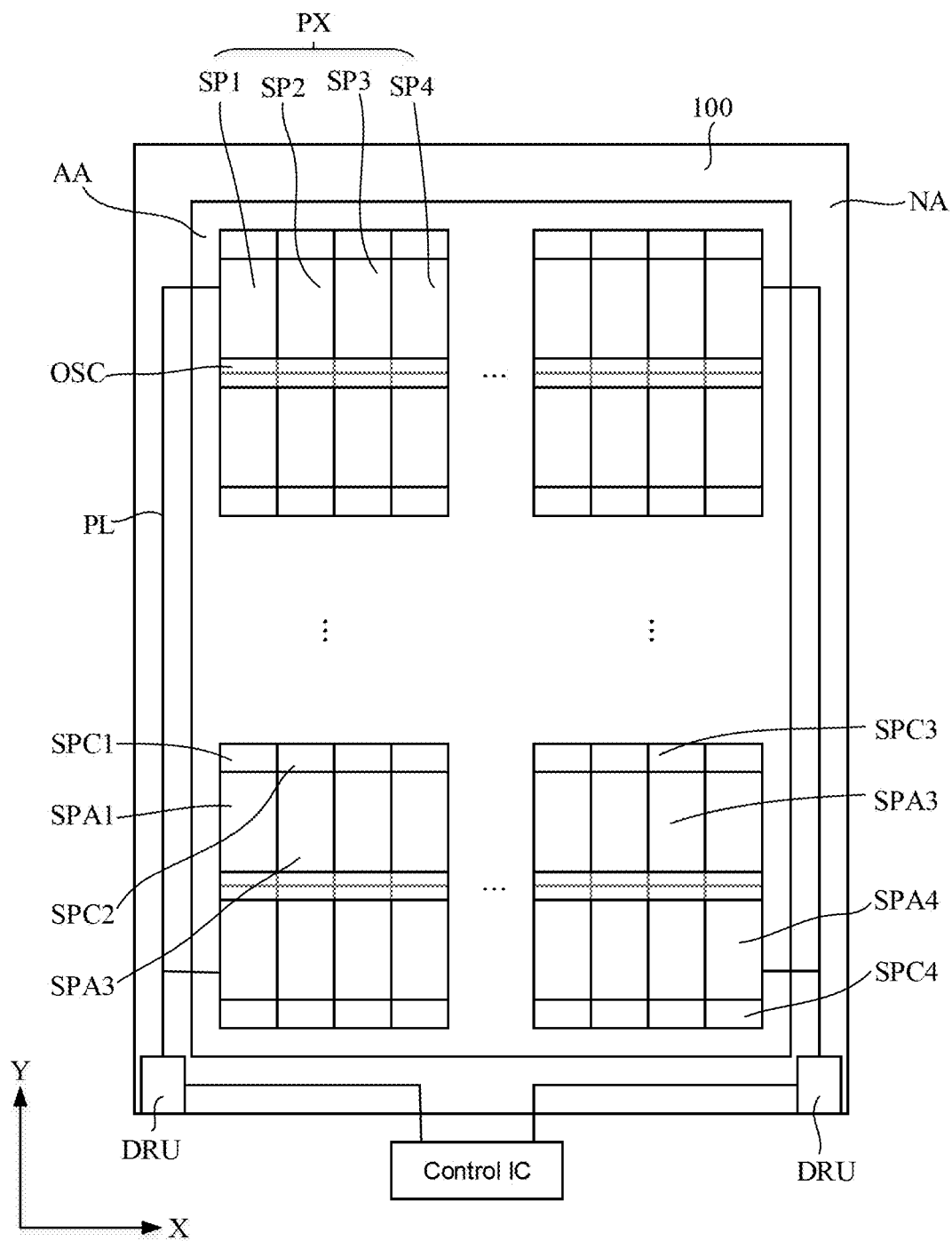
FIG. 1A shows a schematic plan view of a display substrate according to the embodiments of the present disclosure.

It should be noted that, in the accompanying drawings for describing the embodiments of the present disclosure, dimensions of layers, structures or regions may be enlarged or reduced for clarity, i.e., the accompanying drawings are not drawn to actual scale.

DETAILED DESCRIPTION

The technical solutions of the present disclosure will be further specifically described below through the embodiments in conjunction with the accompanying drawings. In this specification, the same or similar reference numerals indicate the same or similar components. The following description of the embodiments of the present disclosure with reference to the accompanying drawings is intended to explain the general inventive concept of the present disclosure, and should not be construed as a limitation of the present disclosure.

Furthermore, in the following detailed description, for convenience of explanation, many specific details are set forth in order to provide a thorough understanding of the embodiments of the present disclosure. Obviously, however, one or more embodiments may be implemented without the specific details.

It should be understood that, although the terms "first," "second," etc. may be used herein to describe different elements, the elements should not be limited by the terms. The terms are only used to distinguish one element from another. For example, without departing from the scope of exemplary embodiments, a first element may be termed a second element, and, similarly, a second element may be termed a first element. As used herein, the term "and/or" includes any and all combinations of one or more of the associated listed items.

It should be understood that when an element or layer is referred to as being "formed on" another element or layer, the element or layer may be directly or indirectly formed on the other element or layer. That is, for example, there may be an intermediate member or layer. In contrast, when an element or layer is referred to as being "formed directly on" another element or layer, there is no intermediate member or layer. Other words (e.g., "between" and "directly between", "adjacent" and "directly adjacent", etc.) used to describe a relationship between elements or layers should be interpreted in a similar manner.

In the present disclosure, directional expressions "first direction". "second direction" are used to describe different directions along a pixel region, e.g., a longitudinal direction and a transverse direction of the pixel region. It should be understood that such representations are exemplary descriptions only, and are not intended to limit the present disclosure.

In the present disclosure, unless otherwise specified, the expression "on the same layer" generally means that a first part and a second part may use the same material and may be formed by the same patterning process. The expression "A and B are integrally connected" means that a part A and a part B are integrally formed, i.e., they generally include the same material and are formed as one structurally continuous integral part.

Transistors used in the embodiments of the present disclosure may all be thin film transistors, field effect transistors, or other devices with the same characteristics. Since a source electrode and a drain electrode of the thin film transistor used here are symmetrical, the source electrode and the drain electrode may be interchanged. In the following examples, the description is mainly made in a case of a P-type thin film transistor used as a drive transistor, and other transistors are of the same type as or different type from the drive transistor according to a circuit design. Similarly, in other embodiments, the drive transistor may also be shown as an N-type thin film transistor.

Some exemplary embodiments of the present disclosure provide a display substrate, including: a substrate; a plurality of pixel units disposed on the substrate, each of the pixel units including a plurality of sub-pixels, and each of the sub-pixels including a light-emitting element and a pixel drive circuit for driving the light-emitting element; a photosensitive circuit disposed on the substrate, the photosensitive circuit configured to sense light emitted by at least one of the pixel units; and a first conductive film layer disposed on the substrate, wherein the pixel drive circuit at least includes a drive transistor, the drive transistor is electrically connected to the light-emitting element, the drive transistor at least includes a drive active layer and a gate electrode, the gate electrode of the drive transistor is located in a side of the drive source layer away from the substrate, and an orthographic projection of the gate electrode of the drive transistor on the substrate at least partially overlaps with an orthographic projection of the drive active layer on the substrate; the first conductive film layer at least comprises a first light shielding portion, the first light shielding portion is located between the substrate and the drive active layer, and an orthographic projection of the first light shielding portion on the substrate at least partially overlaps with the orthographic projection of the drive active layer on the substrate; and the first light shielding portion is electrically connected to the gate electrode of the drive transistor. In this way, the first light shielding portion may prevent light from irradiating a channel region of the drive active layer, and the first light shielding portion and the gate electrode of the drive transistor are connected to the same voltage signal, so that the drive transistor may form a double-gate TFT, which may improve output characteristics of the drive transistor. In the embodiments of the present disclosure, by at least designing an electrical connection mode of the light shielding portion below the drive transistor, output characteristics of the drive transistor may be improved, which is beneficial to a process adjustment of the display substrate including the photosensitive circuit.

Figure 1B:
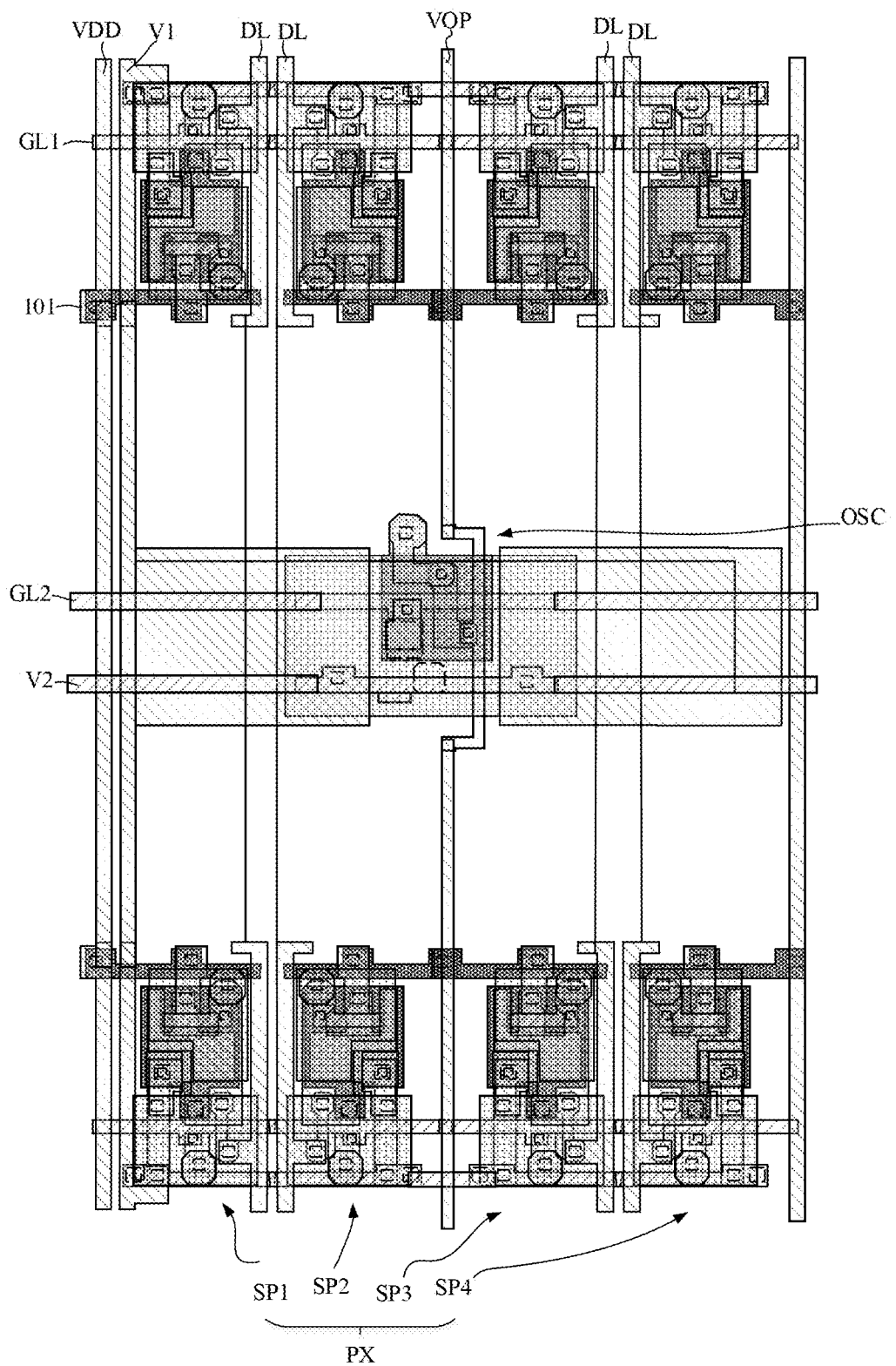
FIG. 1B shows a partial plan view of a display substrate according to the embodiments of the present disclosure.

FIG. 1A shows a schematic plan view of a display substrate according to an embodiment of the present disclosure, and FIG. 1B shows a partial plan view of a display substrate according to an embodiment of the present disclosure, which schematically shows more specific structures of the display substrate. Referring to FIG. 1A and FIG. 1B, the display substrate according to embodiments of the present disclosure may include a substrate 100, a pixel unit PX disposed on the substrate 100, a drive unit DRU disposed on the substrate 100, and a trace PL electrically connecting the pixel unit PX and the drive unit DRU, and the drive unit DRU is used for driving the pixel unit PX.

The display substrate may include a display region AA and a non-display region NA. The display region AA may be a region where the pixel unit PX displaying an image is provided. Each pixel unit PX will be described later. The non-display region NA is a region where no pixel unit PX is provided, that is, a region where no image is displayed. The drive unit DRU for driving the pixel unit PX and some traces PL connecting the pixel unit PX and the drive unit DRU may be disposed in the non-display region NA. The non-display region NA corresponds to a frame in a display device, and a width of the frame may be determined according to a width of the non-display region NA.

The display region AA may have various shapes. For example, the display region AA may has various shapes such as a closed-shaped polygon (e.g., a rectangle) including straight sides, a circle, an ellipse, and the like including curved sides, and a semicircle, semi-ellipse, and the like including straight and curved sides. In the embodiments of the present disclosure, the display region AA is set as a region having a quadrangular shape including straight sides. It should be understood that this is only an exemplary embodiment of the present disclosure, and is not intended to limit the present disclosure.

The non-display region NA may be disposed on at least one side of the display region AA. In the embodiments of the present disclosure, the non-display region NA may surround an outer circumference of the display region AA. In the embodiments of the present disclosure, the non-display region NA may include a lateral portion extending in a first direction X and a longitudinal portion extending in a second direction Y.

The pixel unit PX is disposed in the display region AA. The pixel unit PX is the smallest unit for displaying an image, and there may be a plurality of pixel units PXs. For example, the pixel unit PX may include a light-emitting device that emits white light and/or color light.

The plurality of pixel units PXs may be provided and arranged in a matrix form along a row extending in the first direction X and a column extending in the first direction Y. However, the embodiments of the present disclosure does not specifically limit an arrangement form of the pixel unit PX, and the pixel unit PX may be arranged in various forms. For example, the pixel unit PX may be arranged so that a direction inclined relative to the first direction X and the first direction Y becomes a column direction, and a direction crossing the column direction becomes a row direction.

A pixel unit PX may include a plurality of sub-pixels. For example, a pixel unit PX may include 3 sub-pixels. i.e., a first sub-pixel SP1, a second sub-pixel SP2 and a third sub-pixel SP3. For another example, a pixel unit PX may include 4 sub-pixels, that is, a first sub-pixel SP1, a second sub-pixel SP2, a third sub-pixel SP3 and a fourth sub-pixel SP4. For example, the first sub-pixel SP1 may be a red sub-pixel, the second sub-pixel SP2 may be a green sub-pixel, the third sub-pixel SP3 may be a blue sub-pixel, and the fourth sub-pixel SP4 may be a white sub-pixel.

Each sub-pixel may include a light-emitting element and a pixel drive circuit for driving the light-emitting element. For example, the first sub-pixel SP1 may include a first light-emitting element located in a first light-emitting region SPA1 and a first pixel drive circuit SPC1 for driving the first light-emitting element, and the first light-emitting element may emit red light; the second sub-pixel SP2 may include a second light-emitting element located in a second light-emitting region SPA2 and a second pixel drive circuit SPC2 for driving the second light-emitting element, and the second light-emitting element may emit green light; the third sub-pixel SP3 may include a second light-emitting element located in a third light-emitting region SPA3 and a third pixel drive circuit SPC3 for driving the third light-emitting element, and the third light-emitting element may emit blue light; the fourth sub-pixel SP4 may include a fourth light-emitting element located in a fourth light-emitting region SPA4 and a fourth pixel drive circuit SPC4 for driving the fourth light-emitting element, and the fourth light-emitting element may emit white light.

A light-emitting region of the sub-pixel may be a region where the light-emitting element of the sub-pixel is located. For example, in an OLED display panel, the light-emitting element of the sub-pixel may include an anode, a light-emitting material layer, and a cathode that are arranged in a stack. In this way, the light-emitting region of the sub-pixel may be a region corresponding to a part of the light-emitting material layer sandwiched between the anode and the cathode.

The sub-pixel further includes a non-light-emitting region, for example, the pixel drive circuit of the sub-pixel is located in the non-light-emitting region of the sub-pixel. A ratio of an area of the light-emitting region of each sub-pixel to an overall area (a sum of areas of the light-emitting region and the non-light-emitting region) of the sub-pixel determines an aperture ratio of the sub-pixel.

A light-emitting device (such as a light-emitting layer, referred to as an EL layer for short) of an OLED may not have a good consistency during fabrication. For example, when an EL layer is fabricated by an evaporation process, EL layers of the fabricated sub-pixels are inconsistent due to a limitation of the evaporation process, resulting in non-uniform luminous brightness or chromaticity between different sub-pixels. Moreover, with an increase of use time, the EL layer will age to different degrees, and the EL layer of each sub-pixel will also be inconsistent, resulting in non-uniform luminous brightness or chromaticity between different sub-pixels. In the embodiments of the present disclosure, the display substrate may further include a photosensitive circuit OSC, and the photosensitive circuit OSC may sense light actually emitted by the pixel unit. In this way, in the embodiments of the present disclosure, the display substrate may perform an optical compensation on the sub-pixel in each pixel unit based on the light actually emitted by the pixel unit sensed by the photosensitive circuit OSC, so as to improve a uniformity of light emission of the display substrate.

For example, in some exemplary embodiments of the present disclosure, each pixel unit PX is provided with a photometric circuit OSC. Each photometric circuit OSC senses light actually emitted by the pixel unit PX where each photometric circuit OSC is located.

For example, in the embodiments of the present disclosure, at least two pixel units PXs may share the same photosensitive circuit OSC. Referring to FIG. 1A and FIG. 1B, in pixel units in the same column, two pixel units PXs located in two adjacent rows may share the same photosensitive circuit OSC. In this way, it is not required to provide a photosensitive circuit in each pixel unit PX, so that the number of photosensitive circuits may be reduced, and an aperture ratio may be increased.

When the display substrate is in a display state, the photosensitive circuit OSC may sense light actually emitted by two pixel units adjacent to the photosensitive circuit OSC. For example, the photosensitive circuit OSC may include at least a photoelectric conversion element (which will be described further below). In this way, the photosensitive circuit OSC may be configured to: sense the light actually emitted by the two pixel units adjacent to the photosensitive circuit OSC; and send a sensing electrical signal according to the sensed light.

Referring to FIG. 1A, the photosensitive circuit OSC may send the sensing electrical signal to an external circuit, such as a control IC of the display device. The control IC may control a control signal sent to the pixel unit PX according to the sensing electrical signal, for example, the control IC may control a data signal sent to the pixel drive circuit of each sub-pixel. Under a control of the data signal, each sub-pixel emits light accordingly.

In the embodiments shown in FIG. 1A and FIG. 1B, the sub-pixels SP1, SP2, SP3 and SP4 are arranged side by side, and each of the sub-pixels SP1, SP2, SP3 and SP4 has a data line DL.

Figure 2:
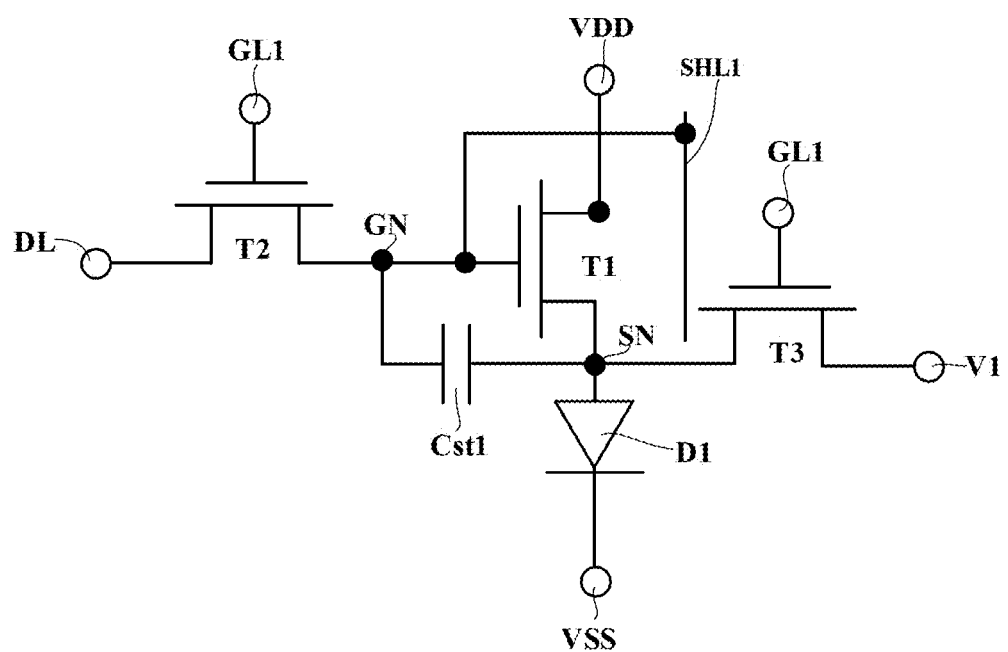
FIG. 2 shows a schematic diagram of a pixel drive circuit of a display substrate according to some exemplary embodiments of the present disclosure.

FIG. 2 shows a schematic diagram of a pixel drive circuit of a display substrate according to some exemplary embodiments of the present disclosure. The pixel drive circuit shown in FIG. 2 may be any one of the above-mentioned pixel drive circuits SPC1, SPC2, SPC3 and SPC4. Referring to FIG. 2, the pixel drive circuit may include a plurality of elements such as a drive transistor T1, a first switch transistor T2, a second switch transistor T3 and a first storage capacitor Cst1. The pixel drive circuit may be referred to as a 3T1C structure.

It should be noted that the pixel drive circuit included in the display substrate according to the embodiments of the present disclosure is described here by taking the 3T1C structure as an example. However, the pixel drive circuit included in the display substrate according to the embodiments of the present disclosure is not limited to the 3T1C structure.

Continuing to refer to FIG. 2, a gate electrode of the first switch transistor T2 is connected to a first scan signal line GL1, a first electrode of the first switch transistor T2 is connected to a data line DL, and a second electrode of the first switch transistor T2 is connected to a gate electrode of the drive transistor T1, for example, the second electrode of the first switch transistor T2 and the gate electrode of the drive transistor T1 may both be electrically connected to a node GN. The first switch transistor T2 is used to control a writing of a voltage signal from the data line DL to the pixel drive circuit.

It should be noted that, in the present disclosure, a first electrode of a transistor may refer to one of a source electrode and a drain electrode of the transistor, and a second electrode of the transistor may refer to the other one of the source electrode and the drain electrode of the transistor.

The gate electrode of the drive transistor T1 is electrically connected to the node GN, a first electrode of the drive transistor T1 is connected to a certain DC voltage signal (e.g., a high voltage level signal VDD), and a second electrode of the drive transistor T1 may be connected to an anode of a light-emitting element D1, so that a drive current may be generated according to a voltage signal so as to drive the light-emitting element D1 to emit light. For example, the light-emitting element D1 may be an organic light-emitting diode (OLED).

Two ends of the first storage capacitor Cst1 are respectively connected between the gate electrode and the source electrode of the drive transistor T1 for storing the voltage signal input from the data line. For example, an end of the first storage capacitor Cst1 is electrically connected to the node GN, and the other end of the first storage capacitor Cst1 is electrically connected to a node SN. That is, an end of the first storage capacitor Cst1, the second electrode of the first switch transistor T2 and the gate electrode of the drive transistor T1 are all electrically connected to the node GN, the other end of the first storage capacitor Cst1, the second electrode of the drive transistor T1 and the anode of the light-emitting element D1 are all electrically connected to the node SN.

A gate electrode of the second switch transistor T3 is connected to the first scan signal line GL1, a first electrode of the second switch transistor T3 is connected to a first reference signal line V1, and a second electrode of the second switch transistor T3 is electrically connected to the node SN.

The anode of the light-emitting element D1 is electrically connected to the node SN, and a cathode of the light-emitting element D1 is electrically connected to a low voltage level signal VSS. The level signals VDD and VSS are both DC voltage signals, which are used to provide a necessary voltage for driving the light-emitting element D1 to emit light.

Continuing to refer to FIG. 2, the display substrate may further include a first light shielding portion SHL1, and the first light shielding part SHL1 is used to protect a channel layer of the drive transistor T1 from being affected by light, so as to improve performances of the drive transistor T1. In the embodiment of FIG. 2, the first light shielding portion SHL1 is electrically connected to the node GN, that is, the first light shielding portion SHL1 is electrically connected to the gate electrode of the drive transistor T1 so as to access a voltage at the gate electrode of the drive transistor T.

Figure 3:
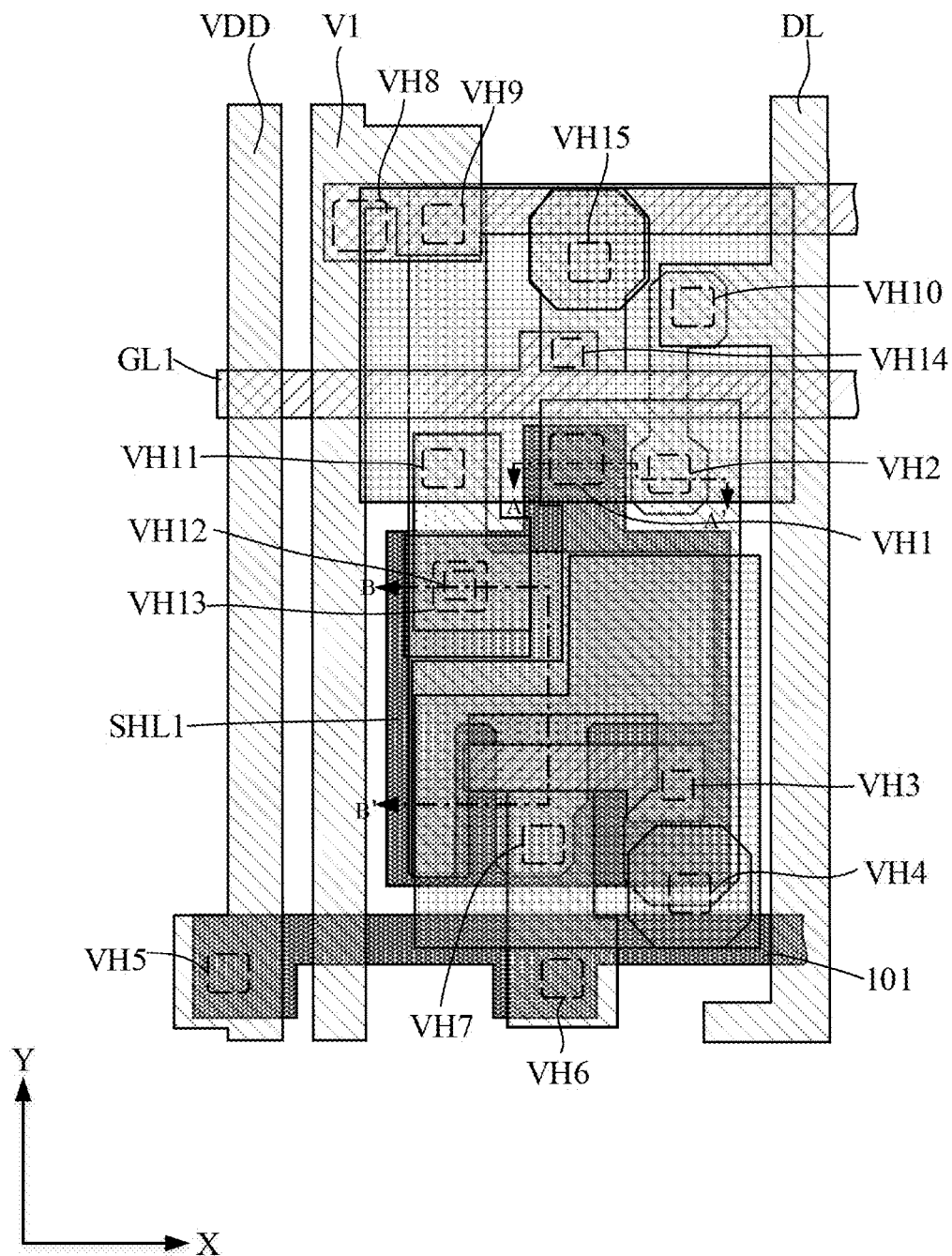
FIG. 3 shows a partial plan view of a display substrate according to some embodiments of the present disclosure, which schematically shows a plan view of a pixel drive circuit included in the display substrate.

FIG. 3 shows a partial plan view of a display substrate according to some embodiments of the present disclosure, which schematically shows a plan view of a pixel drive circuit included in the display substrate. FIG. 4 to FIG. 8 show plan views of a plurality of conductive film layers and semiconductor film layers shown in FIG. 3, respectively.

Figure 4:
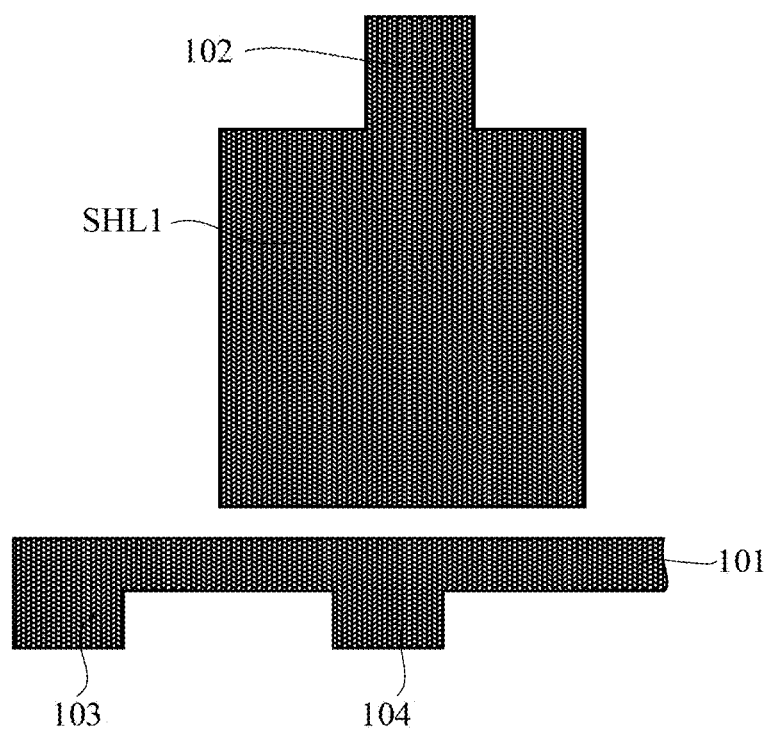
FIG. 4 to FIG. 8 show plan views of a plurality of conductive film layers and semiconductor film layers shown in FIG. 3, respectively.
Figure 5:
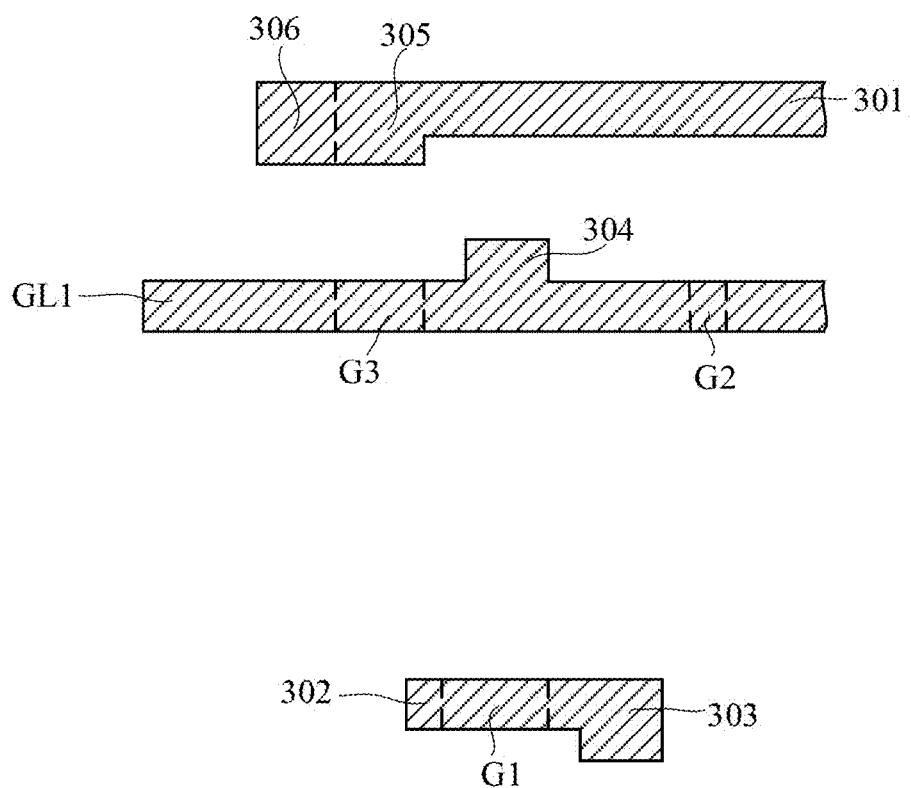
Figure 6:
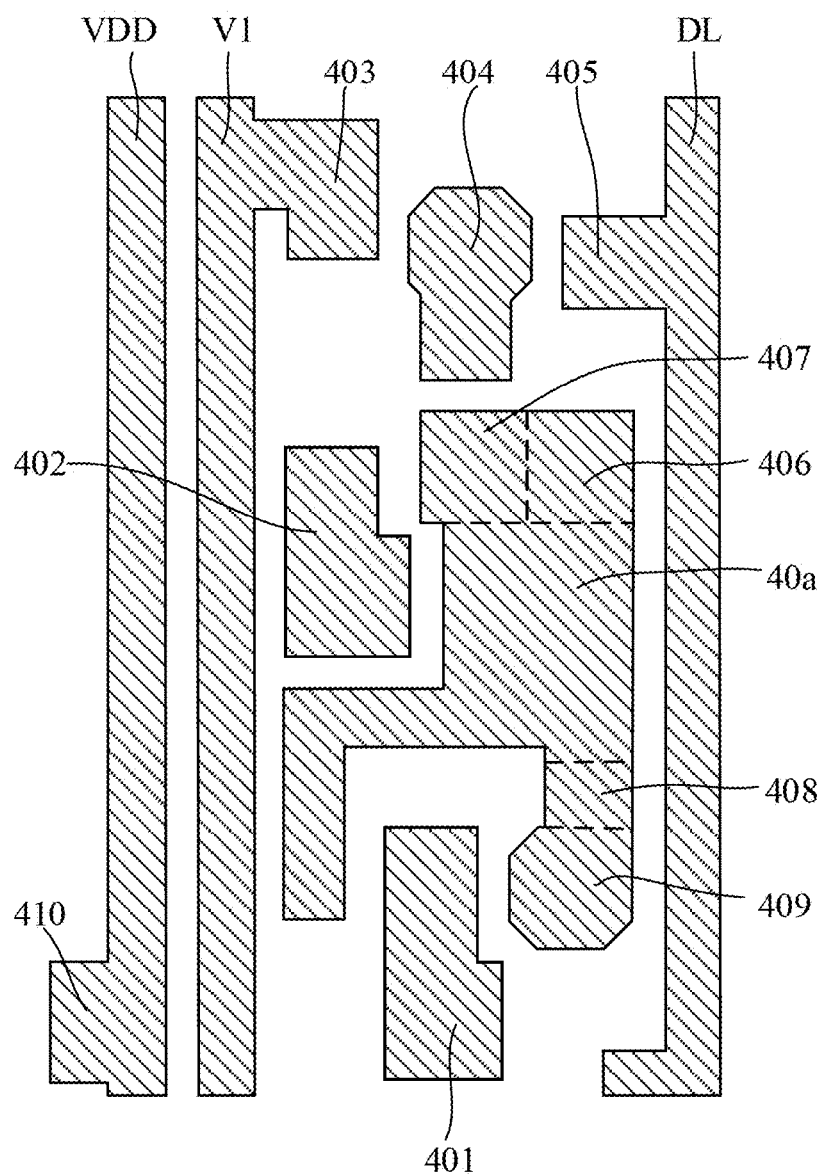
Figure 7:
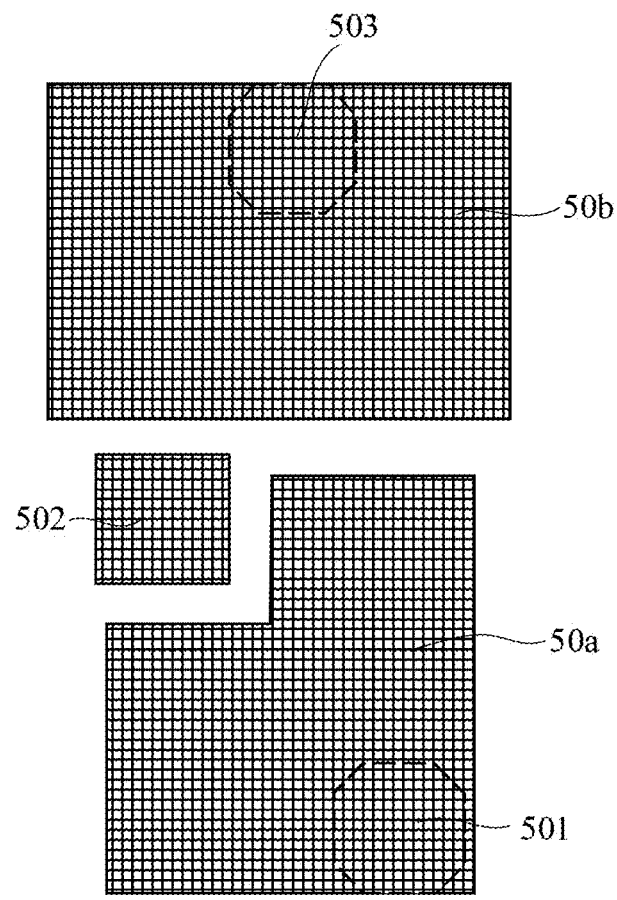
Figure 8:
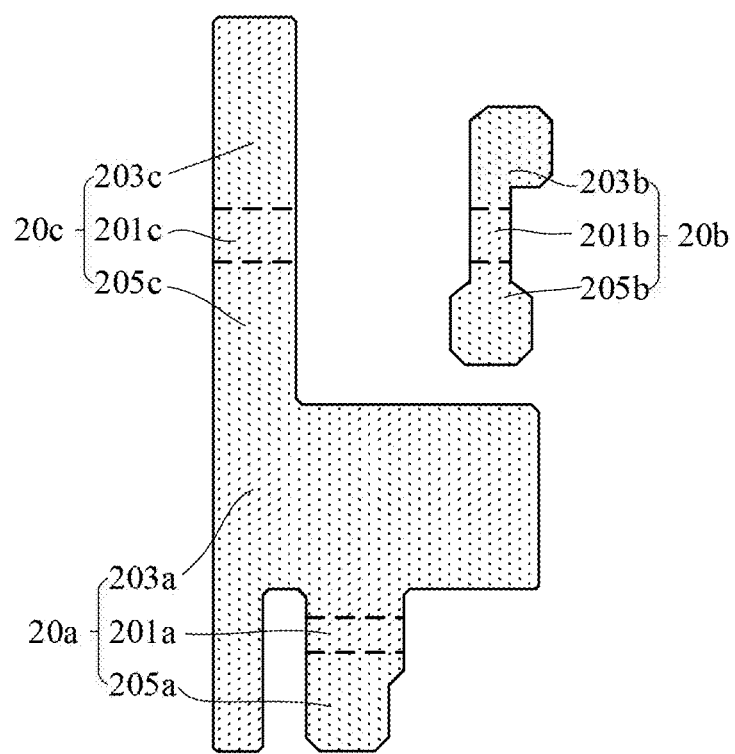

Referring to FIG. 3 to FIG. 8, the display substrate may include a plurality of conductive film layers, a semiconductor film layer and a plurality of insulating film layers. For the convenience of description, the plurality of conductive film layers are described as a first conductive film layer, a second conductive film layer, a third conductive film layer, and a fourth conductive film layer, respectively. For example, FIG. 4 shows a part of a first conductive film layer 10, and the first conductive film layer 10 may be a film layer where a first light shielding portion SHL1 is located. FIG. 5 shows a part of a second conductive film layer 30. The second conductive film layer 30 may be a film layer where the scan signal line GL1 and the gate electrode of the transistor are located, that is, the second conductive film layer 30 may be a conductive film layer composed of gate electrode materials. FIG. 6 shows a part of a third conductive film layer 40. The third conductive film layer 40 may be a film layer where the data line DL, etc., is located, that is, the third conductive film layer 40 may be a conductive film layer composed of source and drain electrode materials. FIG. 7 shows a part of a fourth conductive film layer 50, and the fourth conductive film layer 50 may be a conductive film layer composed of source and drain electrode materials. FIG. 8 shows a semiconductor film layer 20.

For example, the first conductive film layer 10, the semiconductor film layer 20, the second conductive film layer 30, the third conductive film layer 40 and the fourth conductive film layer 50 are sequentially stacked on a base substrate of the display substrate.

The display substrate may include a plurality of signal lines. As shown in FIG. 3, the plurality of signal lines may include a first scan signal line GL1, a data line DL, a first power supply signal line VDD and a first reference signal line V1. The first scan signal line GL1 may be located in the second conductive film layer 30, and the data line DL, the first power supply signal line VDD and the first reference signal line V1 may be located in the third conductive film layer 40.

In the embodiment shown in FIG. 3, the first scan signal line GL1 may extend substantially in the first direction X, and the data line DL, the first power supply signal line VDD and the first reference signal line V1 may extend substantially in the second direction Y. The first reference signal line V1 may be located between the data line DL and the first power supply signal line VDD.

Referring to FIG. 3 and FIG. 8, the drive transistor T1, the first switch transistor T2 and the second switch transistor T3 may be formed along the semiconductor film layers as shown in FIG. 3 and FIG. 8. The semiconductor film layer may have a curved or bent shape, and may include a drive active layer 20a corresponding to the drive transistor T1, a first switch active layer 20b corresponding to the first switch transistor T2, and a second switch active layer 20c corresponding to the second switch transistor T3.

The semiconductor film layer may include materials such as amorphous silicon, polysilicon, or oxide semiconductor, and include, for example, a channel region, a source electrode region, and a drain electrode region. The channel region may be undoped or has a doping type different from that of the source and drain electrode regions, and thus has semiconductor properties. The source electrode region and the drain electrode region are located on two sides of the channel region, respectively, and are doped with impurities, and thus have conductivity. Impurities may vary depending on whether the TFT is an N-type or P-type transistor. For example, in the embodiments of the present disclosure, each transistor may be an N-type thin film transistor.

The drive transistor T1 includes a drive active layer 20a. The drive active layer 20a includes a drive source electrode region 203a, a drive drain electrode region 205a, and a drive channel region 201a connecting the drive source electrode region 203a and the drive drain electrode region 205a.

The first switch transistor T2 includes a first switch active layer 20b. The first switch active layer 20b includes a first switch source electrode region 203b, a first switch drain electrode region 205b, and a first switch channel region 201b connecting the first switch source electrode region 203b and the first switch drain electrode region 205b. The first switch source electrode region 203b and the first switch drain electrode region 205b extend in opposite directions relative to the first switch channel region 201b.

The second switch transistor T3 includes a second switch active layer 20c. The second switch active layer 20c includes a second switch source electrode region 203c, a second switch drain electrode region 205c, and a second switch channel region 201c connecting the second switch source electrode region 203c and the second switch drain electrode region 205c. The second switch source electrode region 203c and the second switch drain electrode region 205c extend in opposite directions relative to the second switch channel region 201c.

Referring to FIG. 3 and FIG. 4, the display substrate may include a first light shielding portion SHL1, a power signal connection portion 101 and a first conductive portion 102 located in the first conductive film layer 10. For example, the first conductive film layer 10 may be made of metal materials, such as silver, copper, aluminum, molybdenum, etc., or alloy materials of the above-mentioned metals, such as aluminum-niobium alloy, molybdenum-niobium alloy, etc., or may be a multi-layer metal, such as Mo/Cu/Mo, etc., or may be a stacked structure formed of metal and transparent conductive materials, such as ITO/Ag/TTO, etc. The first light shielding portion SHL1 and the first conductive portion 102 may be integrally connected, and the power signal connection portion 101 is space apart from the first light shielding portion SHL1. The power signal connection portion 101 may include a second conductive portion 103 and a third conductive portion 104. For example, the first conductive portion 102 may protrude relative to the first light shielding portion SHL1, so that the first light shielding portion SHL1 may be electrically connected to other components through the first conductive portion 102. The second conductive portion 103 and the third conductive portion 104 are wider than other parts of the power signal connection portion 101, so that the power signal connection portion 101 is electrically connected to other components through the second conductive portion 103 and the third conductive portion 104.

Referring to FIG. 3 and FIG. 5, the display substrate may include the first scan signal line GL1, a reference signal connection portion 301 and a drive gate electrode portion 302 located in the second conductive film layer 30. The reference signal connection portion 301 and the drive gate electrode portion 302 may be located on opposite sides of the gate line GL1. The second conductive film layer 30 may be formed of gate electrode materials. For example, the gate electrode materials may include metal materials, such as Mo, Al, Cu and other metals and alloys thereof. Each of the reference signal connection portion 301, the gate line GL1 and the drive gate electrode portion 302 extends substantially in the first direction X, respectively, and the reference signal connection portion 301, the gate line GL1 and the drive gate electrode portion 302 are spaced apart from each other in the second direction Y.

A part of the first scan signal line GL1 overlapping the first switch active layer 20b of the first switch transistor T2 and a part of the first scan signal line GL1 overlapping the second switch active layer 20c of the second switch transistor T3 constitute a gate electrode G2 of the first switch transistor T2 and a gate electrode G3 of the second switch transistor T3, respectively. A part of the drive gate electrode portion 302 overlapping the drive active layer 20a of the drive transistor T1 constitutes a gate electrode G1 of the drive transistor T1.

The drive gate electrode portion 302 includes a fourth conductive portion 303, and the fourth conductive portion 303 is located at an end of the drive gate electrode portion 302. The fourth conductive portion 303 is wider relative to other parts (e.g., the gate electrode G1) of the drive gate electrode portion 302, so that the drive gate electrode portion 302 may be electrically connected to other components through the fourth conductive portion 303.

The first scan signal line GL1 includes a fifth conductive portion 304, and the fifth conductive portion 304 is located between the gate electrode G2 of the first switch transistor T2 and the gate electrode G3 of the second switch transistor T3. The fifth conductive portion 304 is wider than other parts (e.g., the gate electrodes G2 and G3) of the first scan signal line GL1, so that the first scan signal line GL1 may be electrically connected to other components through the fifth conductive portion 304.

The reference signal connection portion 301 includes a sixth conductive portion 305 and a seventh conductive portion 306, and the sixth conductive portion 305 and the seventh conductive portion 306 are located at the same end of the reference signal connection portion 301. Each of the sixth conductive portion 305 and the seventh conductive portion 306 is wider relative to other parts of the reference signal connection portion 301, so that the reference signal connection portion 301 may be electrically connected to other components through the sixth conductive portion 305 and the seventh conductive portion 306.

Referring to FIG. 3 and FIG. 6, the display substrate may include the data line DL, the first power supply signal line VDD, the first reference signal line V1, a first body portion 40a, a first connection portion 401, a second connection portion 402, a third connection portion 403 and a fourth connection portion 404 located in the third conductive film layer 40. The first body portion 40a, the first connection portion 401, the second connection portion 402, the third connection portion 403 and the fourth connection portion 404 are all located between the data line DL and the first power supply signal line VDD. The data line DL, the first power supply signal line VDD, the first reference signal line V1, the first body portion 40a, the first connection portion 401, the second connection portion 402, the third connection portion 403 and the fourth connection portion 404 are all spaced apart from each other.

The display substrate may further include an eighth conductive portion 405, a ninth conductive portion 406, a tenth conductive portion 407, an eleventh conductive portion 408, a twelfth conductive portion 409 and a thirteen conductive portion 410 located in the third conductive film layer 40. The eighth conductive portion 405 is integrally connected with the data line DL, and the eighth conductive portion 405 protrudes toward the first reference signal line V1 relative to the data line DL. The ninth conductive portion 406, the tenth conductive portion 407, the eleventh conductive portion 408 and the twelfth conductive portion 409 are all integrally connected with the first body portion 40a, and the first body portion 40a may be electrically connected to other components through the ninth conductive portion 406, the tenth conductive portions 407, the eleventh conductive portions 408, and the twelfth conductive portion 409. The thirteenth conductive portion 410 is integrally connected with the first power supply signal line VDD, and the thirteenth conductive portion 410 is wider than other parts of the first power supply signal line VDD, so that the first power supply signal line VDD may be electrically connected to other components through the thirteenth conductive portion 410.

An end of each of the first connection portion 401, the second connection portion 402, the third connection portion 403 and the fourth connection portion 404 is electrically connected to components located in other film layers, and the other end is electrically connected to components located in other film layers, so as to achieve the purpose of electrically connecting at least two components.

Referring to FIG. 3 and FIG. 7, the display substrate may include a second body portion 50a and a third body portion 50b located in the fourth conductive film layer 50. The second body portion 50a is spaced apart from the third body portion 50b.

The display substrate may further include a fourteenth conductive portion 501, a fifteenth conductive portion 502 and a sixteenth conductive portion 503 located in the fourth conductive film layer 50. The fourteenth conductive portion 501 is integrally connected with the second body portion 50a. The sixteenth conductive portion 503 is integrally connected with the third body portion 50b. The fifteenth conductive portion 502 is spaced apart from the second body portion 50a and the third body portion 50b.

It should be understood that the display substrate may further include a plurality of insulating film layers located between any two adjacent ones of the substrate 100, the first conductive film layer 10, the semiconductor film layer 20, the second conductive film layer 30, the third conductive film layer 40 and the fourth conductive film layer 50. In the following description, the insulating film layers will be described with reference to cross-sectional views. In the insulating film layers, via holes or grooves exposing at least a part of one of the first conductive film layer 10, the semiconductor film layer 20, the second conductive film layer 30, the third conductive film layer 40 and the fourth conductive film layer 50 may be formed, so as to achieve an electrical connection between components located in different layers.

Figure 9A:
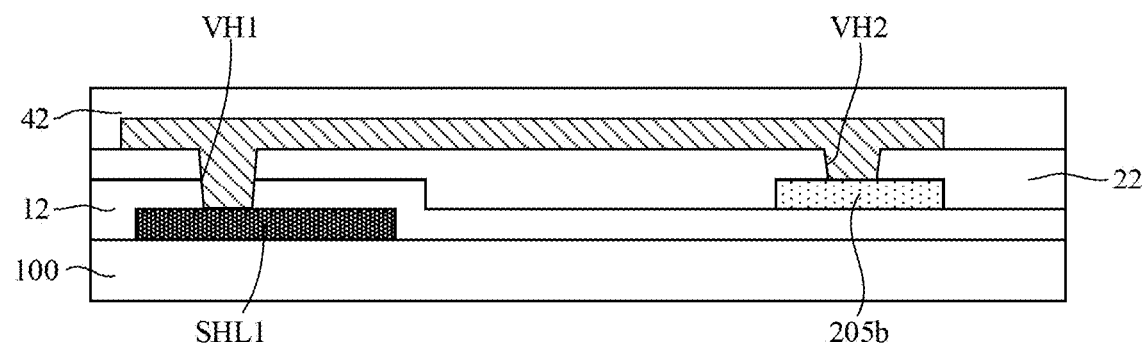
FIG. 9A and FIG. 9B show cross-sectional views of a display substrate taken along lines AA' and BB' in FIG. 3 according to some exemplary embodiments of the present disclosure, respectively.
Figure 9B:
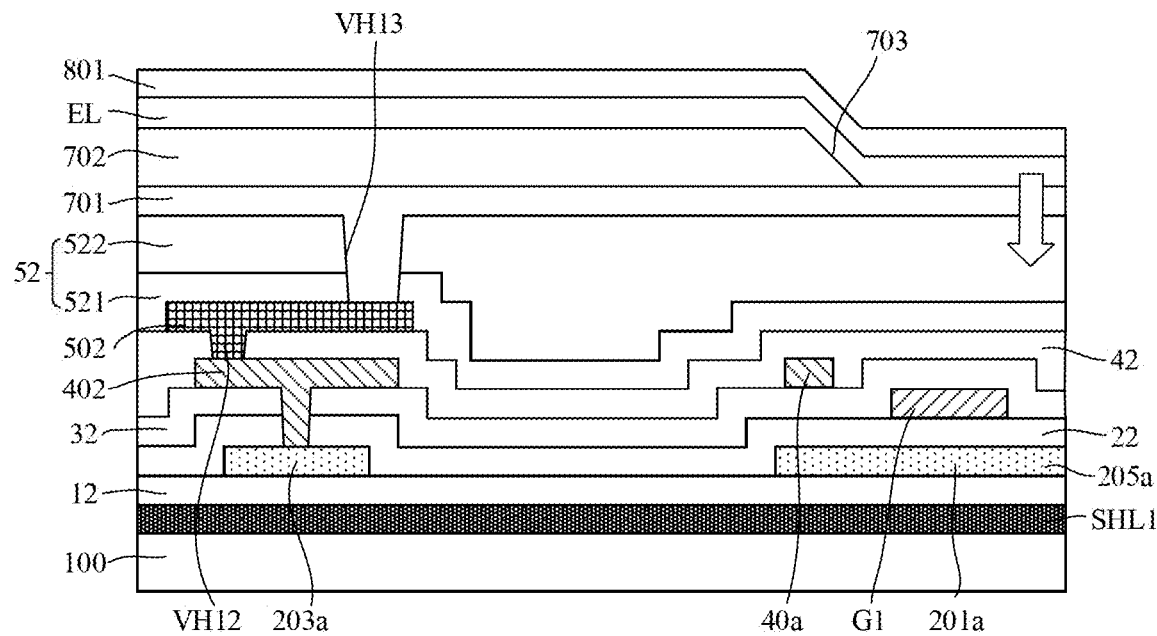

FIG. 9A and FIG. 9B show cross-sectional views of a display substrate taken along lines AA' and BB' in FIG. 3 according to some exemplary embodiments of the present disclosure, respectively. Referring to FIG. 3 to FIG. 9B, the display substrate may include the substrate 100, the first conductive film layer 10 disposed on the substrate 100, and a buffer layer 12 disposed on a side of the first conductive film layer 10 away from the substrate 100, the semiconductor film layer 20 disposed on a side of the buffer layer 12 away from the substrate 100, a gate insulating layer 22 disposed on a side of the semiconductor film 20 away from the substrate 100, and the first semiconductor film layer 30 disposed on a side of the gate insulating layer 22 away from the substrate 100, an interlayer dielectric layer 32 disposed on a side of the second conductive film layer 30 away from the substrate 100, the third conductive film layer 40 disposed on a side of the interlayer dielectric layer 32 away from the substrate 100, a first insulating layer 42 disposed on a side of the third conductive film layer 40 away from the substrate 100, and the fourth conductive film layer 50 disposed on a side of the first insulating layer 42 away from the substrate 100, a second insulating layer 52 disposed on a side of the fourth conductive film layer 50 away from the substrate 100, a sixth conductive film layer disposed on a side of the second insulating layer 52 away from the substrate 100, and a pixel defining layer 702 disposed on a side of the sixth conductive film layer away from the substrate 100.

It should be noted that each of the above-mentioned insulating film layers may include a single-layer structure or a stacked layer structure composed of a plurality of insulating layers. For example, the first insulating layer 42 may include two passivation layers, and the second insulating layer 52 may include a passivation layer and a planarization layer.

For example, the sixth conductive film layer may include a first electrode 701 of the light-emitting element. The sixth conductive film layer may include a conductive material such as ITO, etc. The pixel defining layer 702 may include an opening 703. The display substrate may further include: a light-emitting material layer EL disposed on a side of the pixel defining layer 702 away from the substrate 100 and disposed in the opening 703; and a seventh conductive film layer disposed on a side of the light-emitting material layer EL away from the substrate 100. For example, the seventh conductive film layer may include a second electrode 801 of the light-emitting element. For example, the seventh conductive film layer may include a light-tight conductive material.

In some exemplary embodiments, the first electrode 701 may be an anode of a light-emitting element (e.g., OLED), the second electrode 801 may be a cathode of the light-emitting element, the anode 701 is a transparent electrode, and the cathode 801 is a reflective electrode, and the display substrate may be formed as a bottom emission-type display substrate, as indicated by an arrow in FIG. 9B.

Optionally, the second insulating layer 52 may include a passivation layer 521 and a planarization layer 522, and a color film layer may be disposed between the passivation layer 521 and the planarization layer 522. An orthographic projection of the color film layer on the substrate 100 at least partially overlaps an orthographic projection of the opening 703 on the substrate 100. In this way, light emitted by the light-emitting element may be emitted through the color film layer.

Referring to FIG. 2 to FIG. 9B, the display substrate may include a first via hole VH1, a second via hole VH2, a third via hole VH3, a fourth via hole VH4, a fifth via hole VH5, a sixth via hole VH6, a seventh via hole VH7, an eighth via hole VH8, a ninth via hole VH9, a tenth via hole VH10, an eleventh via hole VH11, a twelfth via hole VH12, and a thirteenth via hole VH13.

The first via hole VH1 exposes at least a part of the first conductive portion 102. Orthographic projections of the tenth conductive portion 407, the first via hole VH1 and the first conductive portion 102 on the substrate 100 at least partially overlap each other. In this way, the tenth conductive portion 407 may be electrically connected to the first conductive portion 102 through the first via hole VH1.

The second via hole VH2 exposes at least a part of the first switch drain electrode region 205b. Orthographic projections of the ninth conductive portion 406, the second via hole VH2 and the first switch drain electrode region 205b on the substrate 100 at least partially overlap each other. In this way, the ninth conductive portion 406 may be electrically connected to the first switch drain electrode region 205b through the second via hole VH2.

In this way, the first light shielding portion SHL1 is electrically connected to the first switch drain electrode region 205b through the first conductive portion 102, the first via hole VH1, the tenth conductive portion 407, the ninth conductive portion 406, the second via hole VH2 and the first switch drain electrode region 205b in sequence.

The third via hole VH3 exposes at least a part of the fourth conductive portion 303. Orthographic projections of the fourth conductive portion 303, the third via hole VH3 and the eleventh conductive portion 408 on the substrate 100 at least partially overlap each other. In this way, the fourth conductive portion 303 may be electrically connected to the eleventh conductive portion 408 through the third via hole VH3. In this way, the drive gate electrode G1 may be electrically connected to the first switch drain electrode region 205b. That is, the first light shielding portion SHL1, the drive gate electrode G1 and the first switching drain electrode region 205b are electrically connected to each other, as shown by the node GN in FIG. 2. That is, the first light shielding portion SHL1 is connected to a gate electrode signal of the drive transistor T1, that is, a signal at the node GN.

In this way, in the embodiments of the present disclosure, the first light shielding portion SHL1 is connected to the signal at the node GN to prevent the first light shielding portion SHL1 from being in a floating state, so that an adverse effect caused by floating may be avoided. Further, referring to FIG. 2, FIG. 3 and FIG. 9B, each of the first light shielding portion SHL1 and the drive gate electrode G1 is connected to the signal at the node GN, and are located on a lower side and an upper side of the drive channel region 201a, respectively, and orthographic projections of the first light shielding portion SHL1, the drive gate electrode G1 and the drive channel region 201a on the substrate 100 at least partially overlap each other. For example, an orthographic projection of each of the first light shielding portion SHL1 and the drive gate electrode G1 on the substrate 100 covers an orthographic projection of the drive channel region 201a on the substrate 100. In this way, the drive transistor T1 may form a double-gate TFT, so that output characteristics of the drive transistor may be improved.

The fourth via hole VH4 exposes at least a part of the twelfth conductive portion 409. Orthographic projections of the fourteenth conductive portion 501, the fourth via hole VH4 and the twelfth conductive portion 409 on the substrate 100 at least partially overlap each other. In this way, the fourteenth conductive portion 501 may be electrically connected to the twelfth conductive portion 409 through the fourth via hole VH4. In this way, the first body portion 40a and the second body portion 50a are electrically connected together. As described above, since the first body portion 40a is connected to the gate electrode signal of the drive transistor T1, the second body portion 50a is also connected to the gate electrode signal of the drive transistor T1.

The fifth via hole VH5 and the sixth via hole VH6 expose at least a part of the second conductive portion 103 and the third conductive portion 104, respectively. Orthographic projections of the thirteenth conductive portion 410, the fifth via hole VH5 and the second conductive portion 103 on the substrate 100 at least partially overlap each other. In this way, the thirteenth conductive portion 410 is electrically connected to the second conductive portion 103 through the fifth via hole VH5. Orthographic projections of the first connection portion 401, the sixth via hole VH6 and the third conductive portion 104 on the substrate 100 at least partially overlap each other. In this way, an end of the first connection portion 401 is electrically connected to the third conductive portion 104 through the sixth via hole VH6.

The seventh via hole VH7 exposes at least a part of the drive drain electrode region 205a. Orthographic projections of the first connection portion 401, the seventh via hole VH7 and the drive drain electrode region 205a on the substrate 100 at least partially overlap each other. In this way, the other end of the first connection portion 401 is electrically connected to the drive drain electrode region 205a through the seventh via hole VH7.

In this way, the first power supply signal line VDD may be electrically connected to the drive drain electrode region 205a, that is, the voltage signal VDD may be connected to a drain electrode of the drive transistor T1.

The eighth via hole VH8 exposes at least a part of the seventh conductive portion 306. Orthographic projections of the third connection portion 403, the eighth via hole VH8 and the seventh conductive portion 306 on the substrate 100 at least partially overlap each other. In this way, the third connection portion 403 is electrically connected to the seventh conductive portion 306 through the eighth via hole VH8.

The ninth via hole VH9 exposes at least a part of the sixth conductive portion 305. Orthographic projections of the sixth conductive portion 305, the ninth via hole VH9 and the second switching source electrode region 203c on the substrate 100 at least partially overlap each other. In this way, the sixth conductive portion 305 is electrically connected to the second switch source electrode region 203c through the ninth via hole VH9.

In this way, the first reference signal line V1 may be electrically connected to the second switch source electrode region 203c, that is, the first reference signal V1 may be connected to a source electrode of the second switch transistor T3.

The tenth via hole VH10 exposes at least a part of the first switch source electrode region 203b. Orthographic projections of the eighth conductive portion 405, the tenth via hole VH10 and the first switching source electrode region 203b on the substrate 100 at least partially overlap each other. In this way, the eighth conductive portion 405 is electrically connected to the first switch source electrode region 203b through the tenth via hole VH10. In this way, the data line DL may be electrically connected to the first switch source electrode region 203b, that is, the data signal may be connected to a source electrode of the first switch transistor T2.

Referring to FIG. 8, the drive source electrode region 203a of the drive transistor T1 is connected to the second switching drain electrode region 205c of the second switch transistor T3, that is, the drive active layer 20a and the second switch active layer 20c are integrally connected. The first switch active layer 20b is spaced apart from the drive active layer 20a and the second switch active layer 20c which are integrally connected. A connection point between the drive source electrode region 203a and the second switching drain electrode region 205c corresponds to the node SN in FIG. 2.

The eleventh via hole VH11 exposes at least a part of the drive source electrode region 203a at the node SN. Orthographic projections of the second connection portion 402, the eleventh via hole VH11 and the drive source electrode region 203a on the substrate 100 at least partially overlap each other. In this way, an end of the second connection portion 402 is electrically connected to the drive source electrode region 203a through the eleventh via hole VH11. The twelfth via hole VH12 exposes at least a part of the second connection portion 402. Orthographic projections of the fifteenth conductive portion 502, the twelfth via hole VH12 and the second connection portion 402 on the substrate 100 at least partially overlap each other. In this way, the other end of the second connection portion 402 is electrically connected to the fifteenth conductive portion 502 through the twelfth via hole VH12. In this way, a signal at the node SN may be led out.

Referring to FIG. 9B, the thirteenth via hole VH13 exposes at least a part of the fifteenth conductive portion 502. Orthographic projections of the first electrode 701 of the light-emitting element, the thirteenth via hole VH13 and the fifteenth conductive portion 502 on the substrate 100 at least partially overlap each other. In this way, the first electrode 701 of the light-emitting element is electrically connected to the fifteenth conductive portion 502 through the thirteenth via hole VH13. In this way, the signal at the node SN may be led out to the first electrode 701 of the light-emitting element, that is, the first electrode 701 of the light-emitting element is electrically connected to the node SN.

The fourteenth via hole VH14 exposes at least a part of the fifth conductive portion 304. Orthographic projections of the fourth connection portion 404, the fourteenth via hole VH14 and the fifth conductive portion 304 on the substrate 100 at least partially overlap each other. In this way, an end of the fourth connection portion 404 is electrically connected to the fifth conductive portion 304 through the fourteenth via hole VH14. The fifteenth via hole VH15 exposes at least a part of the fourth connection portion 404. Orthographic projections of the sixteenth conductive portion 503, the fifteenth via hole VH15 and the fourth connection portion 404 on the substrate 100 at least partially overlap each other. In this way, the other end of the fourth connection portion 404 is electrically connected to the sixteenth conductive portion 503 through the fifteenth via hole VH15. In this way, a signal transmitted by the first scan signal line GL1 may be connected to the third body portion 50b.

In the embodiments of the present disclosure, a region enclosed by orthographic projections of the data line DL, the first power supply signal line VDD, the reference signal connection portion 301 and the power signal connection portion 101 on the substrate 100 forms a pixel drive circuit region. An orthographic projection of a combination of the second body portion 50a, the third body portion 50b and the fifteenth conductive portion 502 located in the fourth conductive film layer 50 on the substrate 100 covers most of the pixel drive circuit region. Since the fourth conductive film layer 50 is located above the first conductive film layer 10, the semiconductor film layer 20, the second conductive film layer 30, the third conductive film layer 40 and other film layers, the fourth conductive film layer 50 may protect the layers. Specifically, in the embodiments of the present disclosure, the photosensitive circuit OSC may include a PIN structure, and a step of forming the PIN structure follows a step of forming the fourth conductive film layer 50. Therefore, the fourth conductive film layer 50 may protect the first conductive film layer 10, the semiconductor film layer 20, the second conductive film layer 30, the third conductive film layer 40 and other film layers in a subsequent process of forming the PIN structure, thereby avoiding a damage to the films caused by the subsequent PIN structure formation process.

Further, in the embodiments of the present disclosure, the second body portion 50a, the third body portion 50b and the fifteenth conductive portion 502 located in the fourth conductive film layer 50 are respectively connected to electrical signals. As described above, the second body portion 50a is connected to the signal at the node GN, the third body portion 50b is connected to the signal transmitted by the first scan signal line GL1, and the fifteenth conductive portion 502 is connected to the signal at the node SN. That is, none of the second body portion 50a, the third body portion 50b, and the fifteenth conductive portion 502 is in a floating state, so that an adverse effect caused by floating is avoided.

Figure 10:
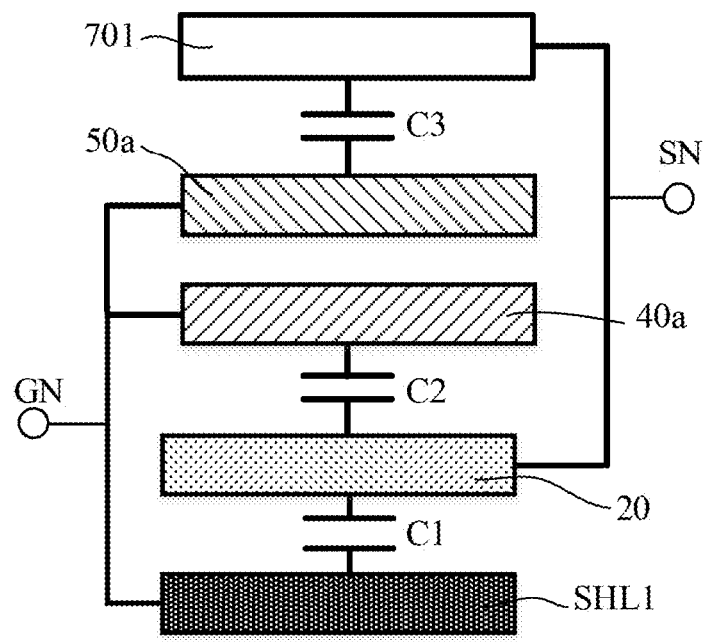
FIG. 10 schematically shows a schematic diagram of a first storage capacitor in FIG.

FIG. 10 schematically shows a schematic diagram of the first storage capacitor Cst1 in FIG. 2. Referring to FIG. 2 to FIG. 10, the first light shielding portion SHL1, the semiconductor film layer 20, the first body portion 40a, the second body portion 50a and the first electrode 701 are sequentially stacked on the substrate 100, and there is at least one insulating layer spaced between two adjacent ones. Orthographic projections of the first light shielding portion SHL1, the semiconductor film layer 20, the first body portion 40a, the second body portion 50a and the first electrode 701 on the substrate 100 at least partially overlap each other. The first light shielding portion SHL1, the first body portion 40a and the second body portion 50a are respectively connected to the signal at the node GN, and the semiconductor film layer 20 and the first electrode 701 are respectively connected to the signal at the node SN. As shown in FIG. 10, a first capacitor C1 is formed between the first light shielding portion SHL1 and the semiconductor film layer 20, a second capacitor C2 is formed between the semiconductor film layer 20 and the first body portion 40a, and a third capacitor C3 is formed between the second body portion 50a and the first electrode 701. A capacitance value of the first storage capacitor Cst1 may be substantially equal to a sum of capacitance values of the first capacitance C1, the second capacitance C2 and the third capacitance C3. In this way, the capacitance value of the first storage capacitor Cst1 may be increased, so that performances of the pixel drive circuit may be improved.

Figure 11:
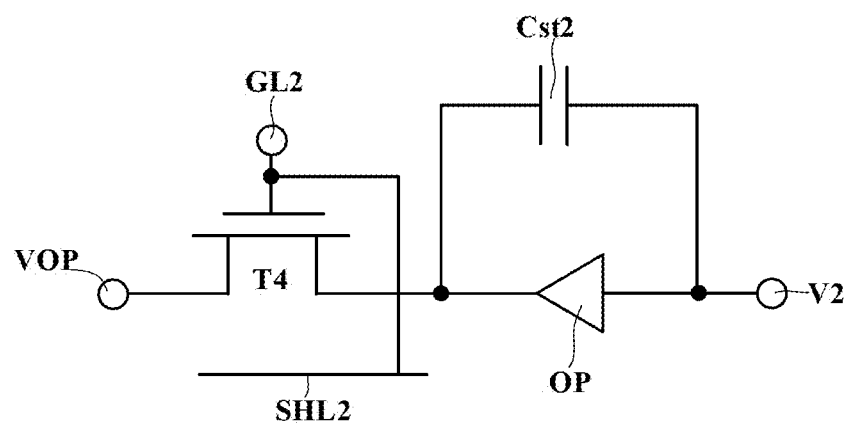
FIG. 11 shows a schematic diagram of a photosensitive circuit included in a display substrate according to some exemplary embodiments of the present disclosure.

FIG. 11 shows a schematic diagram of a photosensitive circuit included in a display substrate according to some exemplary embodiments of the present disclosure. Referring to FIG. 11, the photosensitive circuit OSC may include a photosensitive element OP, a control transistor T4 and a second storage capacitor Cst2. The photosensitive element OP is used to collect an intensity of light emitted by the light-emitting element D1, and send out a sensing electrical signal based on the collected intensity of light. The second storage capacitor Cst2 is connected in parallel with the photosensitive element OP, an input end of the photosensitive element OP is electrically connected to a second reference signal line V2, an output end of the photosensitive element OP is electrically connected to a first electrode of the control transistor T4, a gate electrode of the control transistor T4 is electrically connected to a second scan signal line GL2, and a second electrode of the control transistor T4 is electrically connected to a detection signal line VOP. Specifically, referring to FIG. 1 and FIG. 11, the detection signal line VOP may be electrically connected to an external circuit, such as a control IC of the display device. In this way, the photosensitive circuit OSC may send the sensing electrical signal to the control IC.

Continuing to refer to FIG. 11, the display substrate may further include a second light shielding portion SHL2, and the second light shielding portion SHL2 is used to protect a channel layer of the control transistor T4 from being affected by light, so as to improve performances of the control transistor T4. In the embodiment of FIG. 11, the second light shielding portion SHL2 is electrically connected to the gate electrode of the control transistor T4, that is, the second light shielding portion SHL2 is connected to a voltage at the gate electrode of the control transistor T4.

Figure 12:
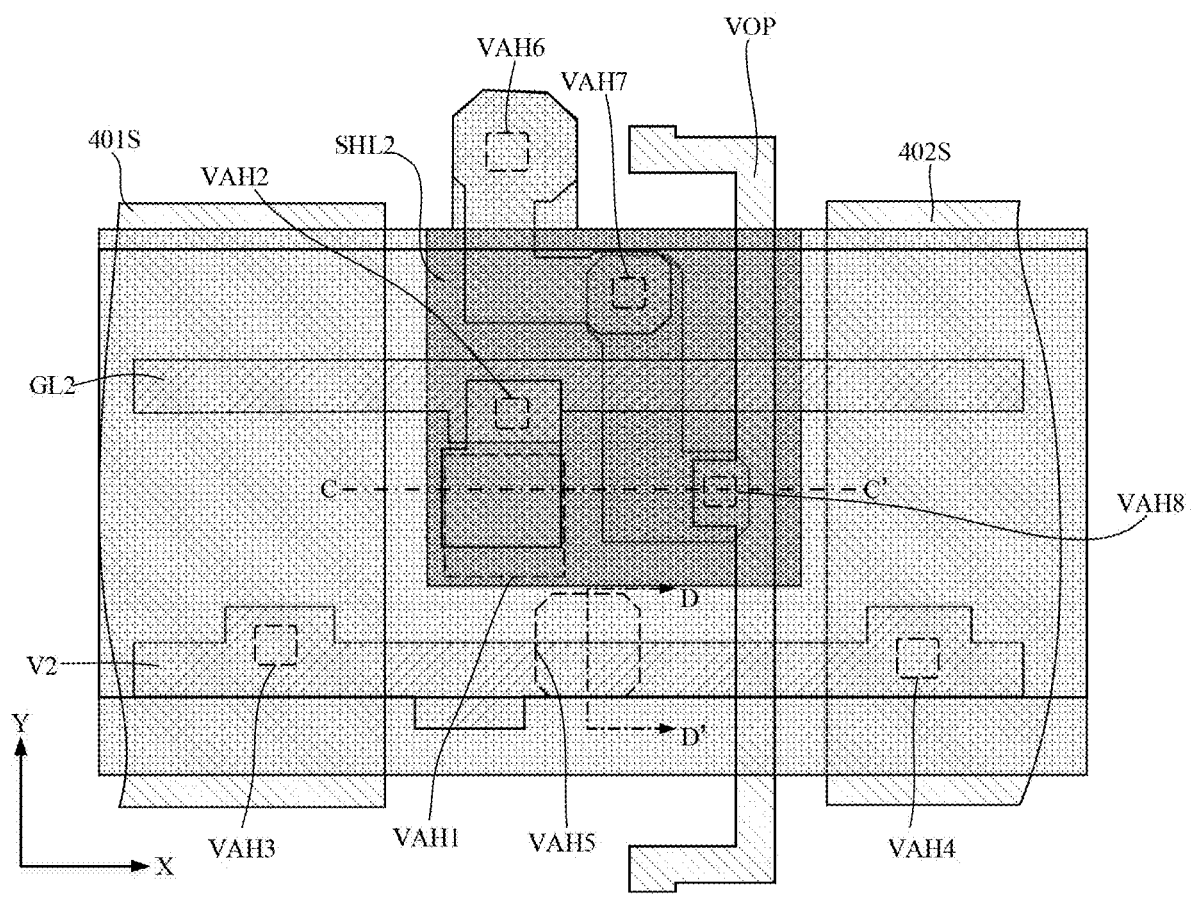
FIG. 12 shows a partial plan view of a display substrate according to some embodiments of the present disclosure, which schematically shows a plan view of a photosensitive circuit included in the display substrate.

FIG. 12 shows a partial plan view of a display substrate according to some embodiments of the present disclosure, which schematically shows a plan view of a photosensitive circuit included in the display substrate. FIG. 13 to FIG. 18 show plan views of a plurality of conductive film layers and semiconductor film layers shown in FIG. 12, respectively.

Figure 13:
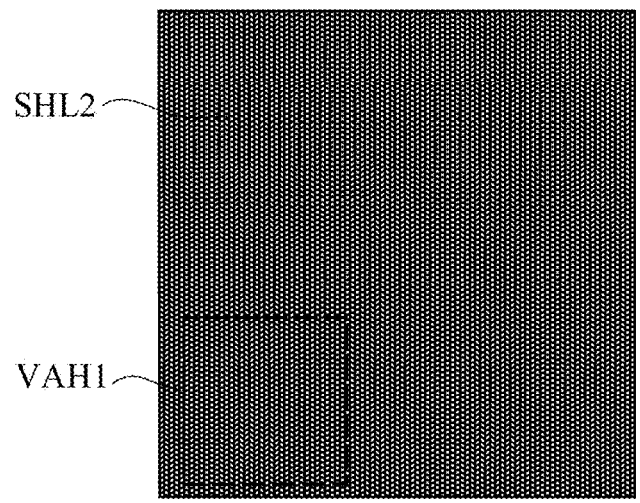
FIG. 13 to FIG. 18 show plan views of a plurality of conductive film layers and semiconductor film layers shown in FIG. 12, respectively.
Figure 14:
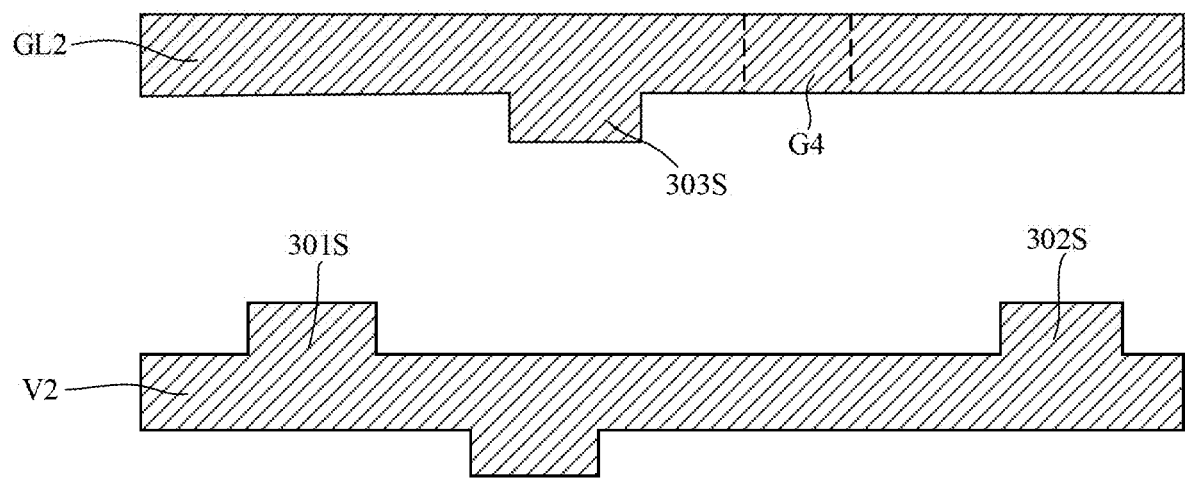
Figure 15:
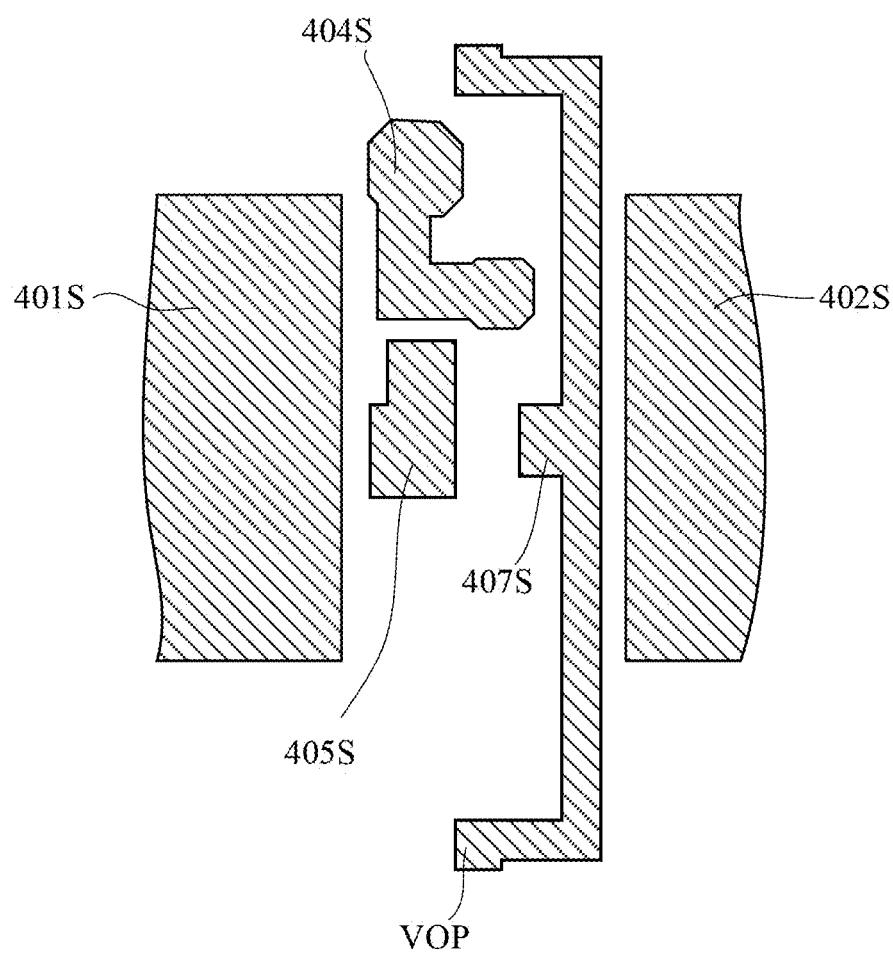
Figure 16:
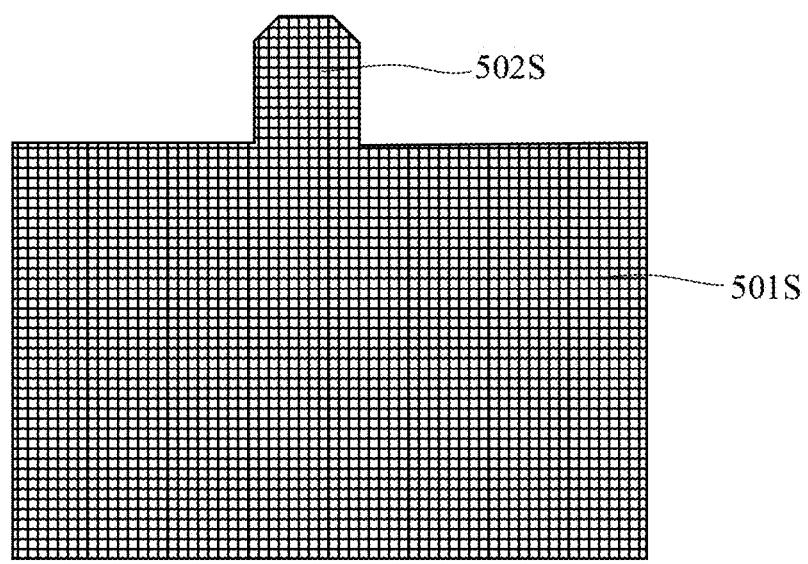
Figure 17:
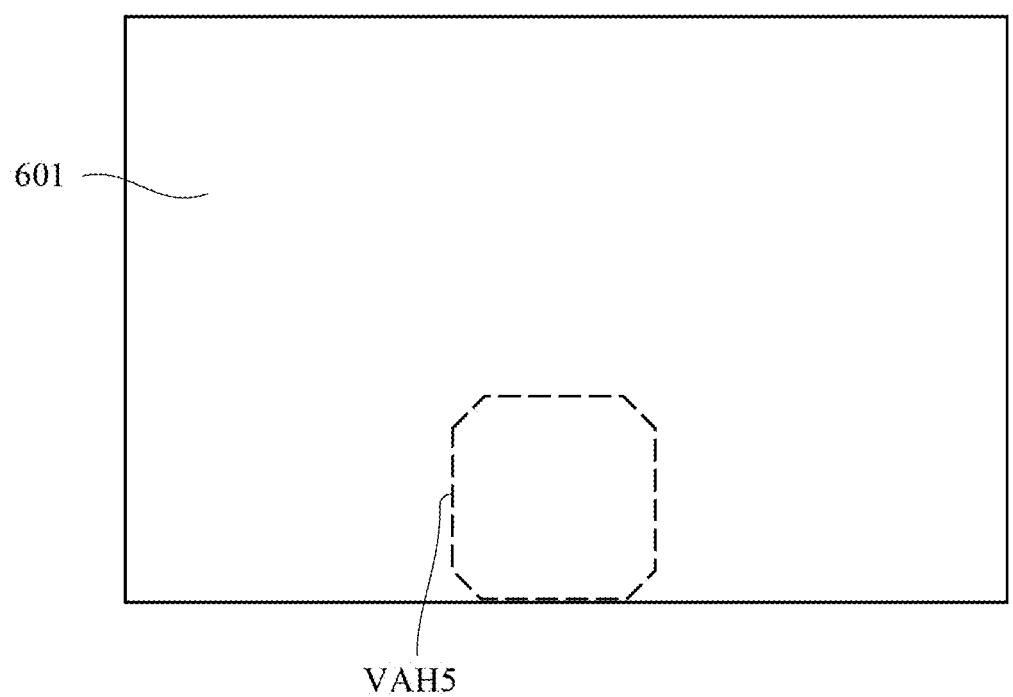
Figure 18:
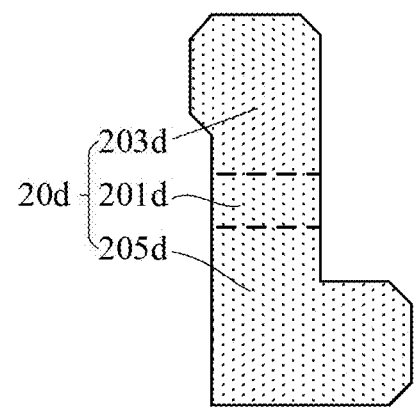

Referring to FIG. 12 to FIG. 18, the display substrate may include a plurality of conductive film layers, a semiconductor film layer and a plurality of insulating film layers. In addition to the above-mentioned first conductive film layer 10, semiconductor film layer 20, second conductive film layer 30, third conductive film layer 40 and fourth conductive film layer 50, the plurality of conductive film layers may further include a fifth conductive film layer 60. For example, the fifth conductive film layer 60 may be a film layer composed of a transparent conductive material such as ITO. Specifically, FIG. 13 shows the first conductive film layer 10 in FIG. 12, FIG. 14 shows the second conductive film layer 30 in FIG. 12, FIG. 15 shows the third conductive film layer 40 in FIG. 12, FIG. 16 shows the fourth conductive film layer 50 in FIG. 12, FIG. 17 shows the semiconductor film layer 20 in FIG. 12, and FIG. 18 shows the fifth conductive film layer 60 in FIG. 12.

For example, the first conductive film layer 10, the semiconductor film layer 20, the second conductive film layer 30, the third conductive film layer 40, the fourth conductive film layer 50 and the fifth conductive film layer 60 are sequentially stacked on the substrate 100 of the display substrate.

The display substrate may include a plurality of signal lines. As shown in FIG. 12, the plurality of signal lines may include the second scan signal line GL2, the second reference signal line V2 and the detection signal line VOP.

In the embodiment shown in FIG. 12, the second scan signal line GL2 and the second reference signal line V2 may extend substantially in the first direction X, and the detection signal line VOP may extend substantially in the second direction Y.

Referring to FIG. 12 and FIG. 17, an active layer of the control transistor T4 may be formed along the semiconductor film layer as shown in FIG. 12 and FIG. 17. The semiconductor film layer may have a curved or bent shape, and may include a control active layer 20d corresponding to the control transistor T4.

The control transistor T4 includes the control active layer 20d. The control active layer 20d includes a control source electrode region 203d, a control drain electrode region 205d, and a control channel region 201d connecting the control source electrode region 203d and the control drain electrode region 205d. The control source electrode region 203d and the control drain electrode region 205d extend in opposite directions relative to the control channel region 201d.

Referring to FIG. 12 and FIG. 13, the display substrate may include a second light shielding portion SHL2 located in the first conductive film layer 10. For example, an orthographic projection of the second light shielding portion SHL2 on the substrate 100 may have a substantially rectangular shape, for example, a rounded rectangle.

Referring to FIG. 12 and FIG. 14, the display substrate may include the second scan signal line GL2 and the second reference signal line V2 located in the second conductive film layer 30. Each of the second scan signal line GL2 and the second reference signal line V2 extends substantially in the first direction X, and the second scan signal line GL2 and the second reference signal line V2 are spaced apart from each other in the second direction Y.

A part of the second scan signal line GL2 overlapping the control active layer 20d of the control transistor T4 constitutes a gate electrode G4 of the control transistor T4.

The second reference signal line V2 may include a fifth conductive connection portion 301S and a second conductive connection portion 302S, and the fifth conductive connection portion 301S is spaced apart from the second conductive connection portion 302S. Each of the fifth conductive connection portion 301S and the second conductive connection portion 302S is wider relative to other parts of the second reference signal line V2, so that the second reference signal line V2 may be electrically connected to other components through the fifth conductive connection portion 301S and the second conductive connection portion 302S.

The second scan signal line GL2 may include a third conductive connection portion 303S, and the third conductive connection portion 303S is wider than other parts of the second scan signal line GL2, so that the second scan signal line GL2 may be electrically connected to other components through the third conductive connection portion 303S.

Referring to FIG. 12 and FIG. 15, the display substrate may include the detection signal line VOP, a first conductive body portion 401S, a second conductive body portion 402S, a fourth conductive connection portion 404S, a first conductive body portion 401S, a fourth conductive connection portion 404S, a first conductive connection portion 405S, a sixth conductive connection portion 406S and a seventh conductive connection portion 407S located in the third conductive film layer 40. The first conductive body portion 401S is spaced apart from the second conductive body portion 402S in the first direction X, and the detection signal line VOP, the fourth conductive connection portion 404S, the first conductive connection portion 405S, the sixth conductive connection portion 406S and the seventh conductive connection portion 407S may be disposed between the first conductive body portion 401S and the second conductive body portion 402S. The detection signal line VOP, the fourth conductive connection portion 404S, the first conductive connection portion 405S, and the sixth conductive connection portion 406S are spaced apart from each other. An end of each of the fourth conductive connection portion 404S, the first conductive connection portion 405S and the sixth conductive connection portion 406S is electrically connected to components located in other film layers, and the other end is electrically connected to components located in other film layers, so as to achieve the purpose of electrically connecting at least two components.

The seventh conductive connection portion 407S is integrally connected with the detection signal line VOP. For example, the seventh conductive connection portion 407S protrudes toward the first conductive connection portion 405S relative to the detection signal line VOP, so that the detection signal line VOP is electrically connected to other components through the seventh conductive connection portion 407S.

Referring to FIG. 12 and FIG. 16, the display substrate may include a third conductive body portion 501S and a seventh conductive connection portion 502S located in the fourth conductive film layer 50. The seventh conductive connection portion 502S is integrally connected with the third conductive body portion 501S. In this way, the third conductive body portion 501S may be electrically connected to other components through the seventh conductive connection portion 502S.

Referring to FIG. 12 and FIG. 18, the display substrate may include a first sensing electrode 601 located in the fifth conductive film layer 60.

Figure 19A:
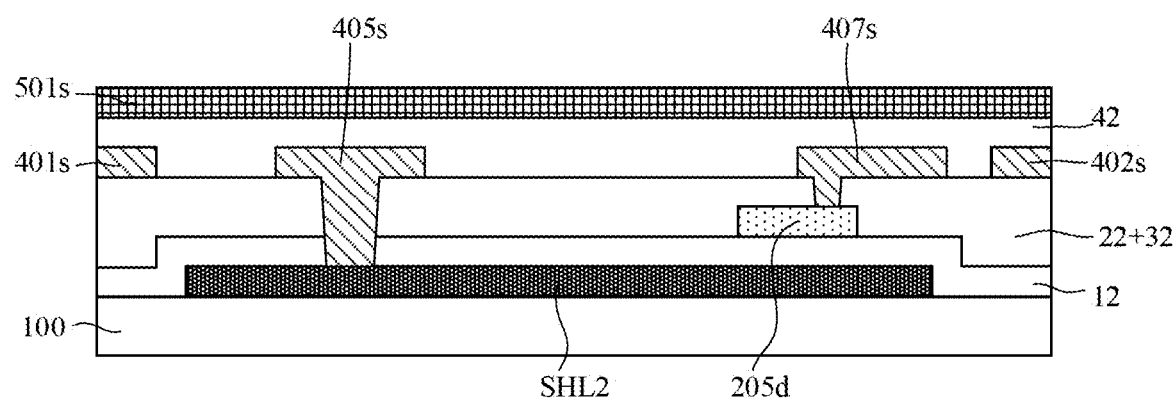
FIG. 19A and FIG. 19B show cross-sectional views of a display substrate taken along lines CC' and DD' in FIG. 12 according to some exemplary embodiments of the present disclosure, respectively.
Figure 19B:
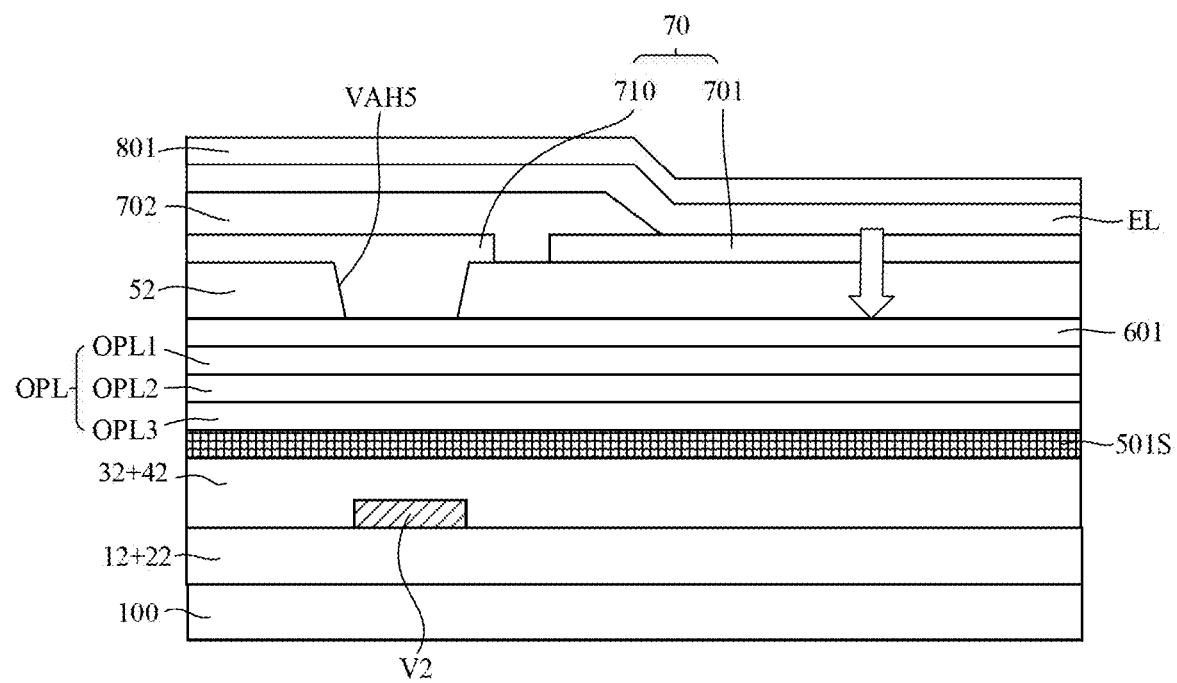

FIG. 19A and FIG. 19B show cross-sectional views of a display substrate taken along lines CC' and DD' in FIG. 12 according to some exemplary embodiments of the present disclosure, respectively. Referring to FIG. 9A, FIG. 9B and FIG. 11 to FIG. 19B, the display substrate may include the substrate 100, the first conductive film layer 10 disposed on the substrate 100, the buffer layer 12 disposed on the side of the first conductive film layer 10 away from the substrate 100, the semiconductor film layer 20 disposed on the side of the buffer layer 12 away from the substrate 100, the gate insulating layer 22 disposed on the side of the semiconductor film 20 away from the substrate 100, the second conductive film layer 30 disposed on the side of the gate insulating layer 22 away from the substrate 100, the interlayer dielectric layer 32 disposed on the side of the second conductive film layer 30 away from the substrate 100, the third conductive film layer 40 disposed on the side of the interlayer dielectric layer 32 away from the substrate 100, the first insulating layer 42 disposed on the side of the third conductive film layer 40 away from the substrate 100, the fourth conductive film layer 50 disposed on the side of the first insulating layer 42 away from the substrate 100, and a photosensitive layer OPL disposed on the side of the fourth conductive film layer 50 away from the substrate 100, the fifth conductive film layer 60 is disposed on a side of the photosensitive layer OPL away from the substrate 100, the second insulating layer 52 disposed on a side of the fifth conductive film layer 60 away from the substrate 100, the sixth conductive film layer 70 disposed on the side of the second insulating layer 52 away from the substrate 100, and the pixel defining layer 702 disposed on a side of the sixth conductive film layer 70 away from the substrate 100.

In the embodiments of the present disclosure, the photosensitive element OP may include the first sensing electrode 601, a second sensing electrode, and the photosensitive layer OPL sandwiched between the first sensing electrode 601 and the second sensing electrode. For example, the third conductive body portion 501S located in the fourth conductive film layer 50 may form the second sensing electrode. That is, the third conductive body portion 501S may also be referred to as a second sensing electrode 501S.

The photosensitive layer OPL may include a first semiconductor layer OPL1, an intrinsic semiconductor layer OPL2, and a second semiconductor layer OPL3.

For example, the first semiconductor layer OPL1 may be a semiconductor layer formed by N-type/P-type doping of semiconductor materials such as amorphous silicon, amorphous germanium, and compounds thereof, or may directly use semiconductor materials such as silicon, germanium, and compounds thereof, or may also use semiconductor materials such as IGZO, ZnO. ITGO, etc. The first semiconductor layer OPL1 may contact the first sensing electrode 601.

The intrinsic semiconductor layer OPL2 may use semiconductor materials such as amorphous silicon, amorphous germanium and compounds thereof, which may be disposed on a side of the first semiconductor layer OPL1 away from the first sensing electrode 601.

The second semiconductor layer OPL3 may be a semiconductor layer formed by N-type/P-type doping of semiconductor materials such as silicon, germanium and compounds thereof, or may use semiconductor materials such as silicon, germanium and compounds thereof, or may also use semiconductor materials such as IGZO, ZnO, etc. The second semiconductor layer OPL3 may contact the second sensing electrode 501S.

It should be noted that if the first semiconductor layer OPL1 is an N-type semiconductor layer, the second semiconductor layer OPL3 is a P-type semiconductor layer; if the first semiconductor layer OPL1 is a P-type semiconductor layer, the second semiconductor layer OPL3 is an N-type semiconductor layer.

As shown in FIG. 19A and FIG. 19B, the first sensing electrode 601 may be made of a transparent conductive material, such as ITO (Indium Tin Oxide), etc., for light may pass therethrough. As indicated by the arrow in the figure, light emitted by the pixel unit is irradiated on the photosensitive element OP, and specifically, on the photosensitive layer OPL; the photosensitive layer OPL converts the light irradiated thereon into a corresponding electrical signal, and the second sensing electrode 501S outputs the electrical signal as a sensing electrical signal.

Referring to FIG. 11 to FIG. 19B, the display substrate may include a first conductive via hole VAH1, a second conductive via hole VAH2, a third conductive via hole VAH3, a fourth conductive via hole VAH4, a fifth conductive via hole VAH5, a sixth conductive via hole VAH6, a seventh conductive via hole VAH7, and an eighth conductive via hole VAH8.

The first conductive via hole VAH1 exposes at least a part of the second light shielding portion SHL2. Orthographic projections of the first conductive connection portion 405S, the first conductive via hole VAH1 and the second light shielding portion SHL2 on the substrate 100 at least partially overlap each other. In this way, an end of the first conductive connection portion 405S may be electrically connected to the second light shielding portion SHL2 through the first conductive via hole VAH1.

The second conductive via hole VAH2 exposes at least a part of the third conductive connection portion 303S. Orthographic projections of the first conductive connection portion 405S, the second conductive via hole VAH2 and the third conductive connection portion 303S on the substrate 100 at least partially overlap each other. In this way, the other end of the first conductive connection portion 405S may be electrically connected to the third conductive connection portion 303S through the second conductive via hole VAH2. In this way, an electrical connection between the second light shielding portion SHL2 and the second scan signal line GL2 is achieved, that is, the second light shielding portion SHL2 is connected to a gate electrode signal of the control transistor T4.

In this way, in the embodiments of the present disclosure, the second light shielding portion SHL2 is connected to the gate electrode signal of the control transistor T4 to prevent the second light shielding portion SHL2 from being in a floating state, so that an adverse effect caused by floating may be avoided. Further, referring to FIG. 11, FIG. 12 and FIG. 19B, both the second light shielding portion SHL2 and the gate electrode G4 of the control transistor T4 are connected to a gate electrode signal transmitted by the second scan signal line GL2, and are respectively located in a lower side and an upper side of the control channel region 201d. Orthographic projections of the second light shielding portion SHL2, the gate electrode G4 of the control transistor T4 and the control channel region 201d on the substrate 100 at least partially overlap each other, for example, an orthographic projection of each of the second light shielding portion SHL2 and the gate electrode G4 of the control transistor T4 on the substrate 100 covers an orthographic projection of the control channel region 201d on the substrate 100. In this way, the control transistor T4 may form a double-gate TFT, so that output characteristics of the control transistor may be improved.

Figure 20A:
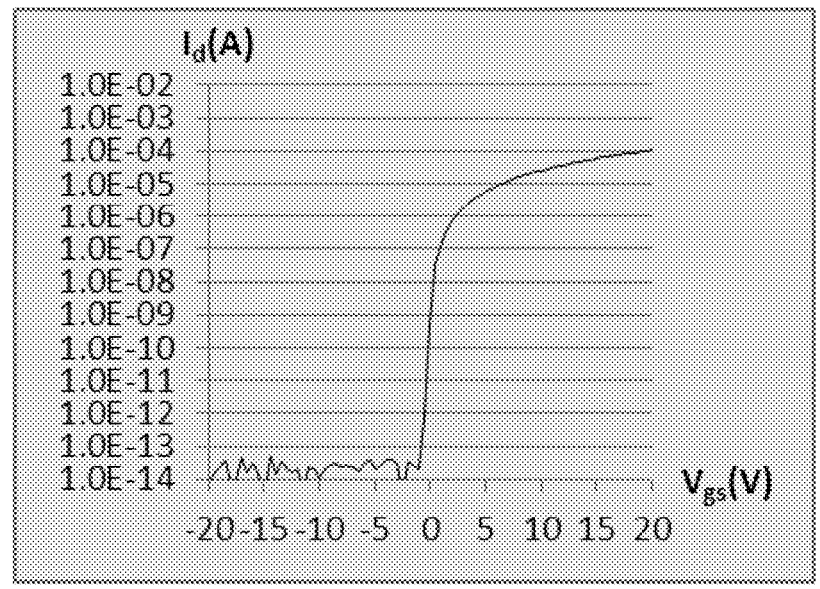
FIG. 20A and FIG. 20B schematically show output characteristic curves of a drive transistor and a control transistor included in a display substrate according to embodiments of the present disclosure, respectively.
Figure 20B:
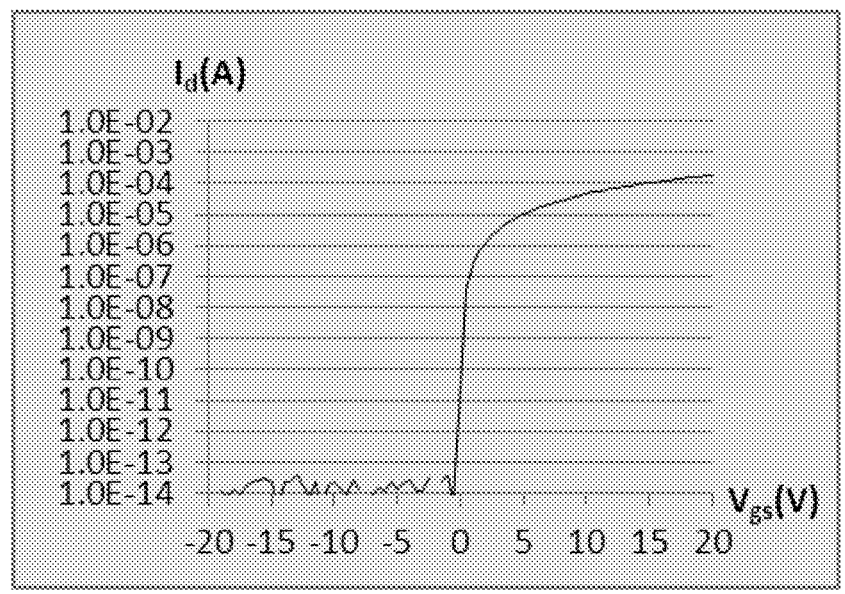

FIG. 20A and FIG. 20B schematically show output characteristic curves of the drive transistor T1 and the control transistor T4 included in a display substrate according to embodiments of the present disclosure, respectively. In FIG. 20A and FIG. 20B, the abscissa is a gate-source voltage Vgs of the transistor, the ordinate is a current Id of the transistor, and the output characteristic curves shown in FIGS. 20A and 20B are output characteristic curves of the source-drain voltages Vds of the drive transistor T1 and the control transistor T4 at 15.1V.

It may be shown from FIG. 20A and FIG. 20B, in a case that the each of the first light shielding portion SHL1 and the second light shielding portion SHL2 is connected to a gate electrode signal of a corresponding transistor, both the drive transistor T1 and the control transistor T4 have good output characteristics. Moreover, due to a light-shielding effect of the first light shielding portion SHL1 and the second light shielding portion SHL2, an interference of light to the transistors T1 and T4 may be avoided, and at the same time, the transistors T1 and T4 both form a double-gate structure, thereby reducing a leakage current of the transistors T1 and T4 in an OFF state.

In addition, in the embodiments of the present disclosure, the photosensitive layer OPL has a PIN structure. During a process of forming the PIN structure, a large amount of H elements may be generated, which may greatly affect characteristics of the transistor. In the above-mentioned embodiments, each of the light shielding portions for the drive transistor T1 and the control transistor T4 is connected to a gate electrode signal of a corresponding transistor. That is, electrical connection modes of the two light shielding portions are the same, which may facilitate a process adjustment and may more fully protect a channel region of the transistor. It is found through a simulation experiment that the display substrate provided by the embodiments of the present disclosure has good display images and fewer defects.

The third conductive via hole VAH3 and the fourth conductive via hole VAH4 expose at least a part of the fifth conductive connection portion 301S and the second conductive connection portion 302S, respectively. Orthographic projections of the first conductive body portion 401S, the third conductive via hole VAH3 and the fifth conductive connection portion 301S on the substrate 100 at least partially overlap each other. Orthographic projections of the second conductive body portion 402S, the fourth conductive via hole VAH4 and the second conductive connection portion 302S on the substrate 100 at least partially overlap each other. In this way, the first conductive body portion 401S is electrically connected to the fifth conductive connection portion 301S through the third conductive via hole VAH3, and the second conductive body portion 402S is electrically connected to the second conductive connection portion 302S through the fourth conductive via hole VAH4. In this way, the first conductive body portion 401S and the second conductive body portion 402S are electrically connected to the second reference signal line V2, that is, the first conductive body portion 401S and the second conductive body portion 402S are connected to the voltage signal V2 transmitted by the second reference signal line V2.

The fifth conductive via hole VAH5 exposes at least a part of the first sensing electrode 601. The first sensing electrode 601 may be electrically connected to the second reference signal line V2 through the fifth conductive via hole VAH5, that is, the first sensing electrode 601 is connected to the voltage signal V2 transmitted by the second reference signal line V2.

The sixth conductive via hole VAH6 exposes at least a part of the fourth conductive connection portion 404S. Orthographic projections of the seventh conductive connection 502S, the sixth conductive via hole VAH6 and the fourth conductive connection 404S on the substrate 100 at least partially overlap each other. In this way, the seventh conductive connection portion 502S is electrically connected to an end of the fourth conductive connection portion 404S through the sixth conductive via hole VAH6. The seventh conductive via hole VAH7 exposes at least a part of the control source electrode region 203d. Orthographic projections of the fourth conductive connection portion 404S, the seventh conductive via hole VAH7 and the control source electrode region 203d on the substrate 100 at least partially overlap each other. In this way, the other end of the fourth conductive connection portion 404S is electrically connected to the control source electrode region 203d through the seventh conductive via hole VAH7. In this way, the second sensing electrode 501S is electrically connected to the control source electrode region 203d, that is, the second sensing electrode 501S is electrically connected to a source electrode of the control transistor T4.

The eighth via hole VAH8 exposes at least a part of the control drain electrode region 205d. Orthographic projections of the detection signal line VOP, the eighth via hole VAH8 and the control drain electrode region 205d on the substrate 100 at least partially overlap each other. In this way, the detection signal line VOP is electrically connected to the control drain electrode region 205d through the eighth conduction through hole VAH8. In this way, a drain electrode of the control transistor T4 is electrically connected to the detection signal line VOP.

Figure 21:
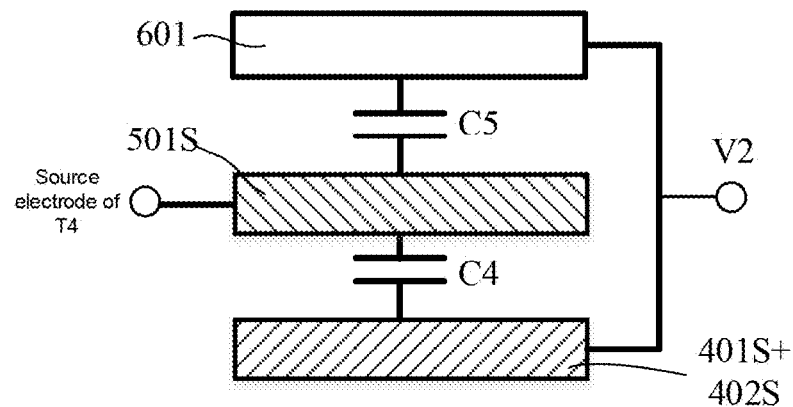
FIG. 21 schematically shows a schematic diagram of a second storage capacitor of FIG. 11.

FIG. 21 schematically shows a schematic diagram of the second storage capacitor Cst2 in FIG. 11. Referring to FIG. 11 to FIG. 21, a combination of the first conductive body portion 401S and the second conductive body portion 402S, the second sensing electrode 501S and the first sensing electrode 601 are sequentially stacked on the substrate 100, and there is at least one insulating layer spaced between two adjacent ones. Orthographic projections of the combination of the first conductive body portion 401S and the second conductive body portion 402S, the second sensing electrode 501S and the first sensing electrode 601 on the substrate 100 at least partially overlap each other. The first conductive body portion 401S and the second conductive body portion 402S are both connected to the voltage signal V2 transmitted by the second reference signal line V2, the second sensing electrode 501S is electrically connected to the source electrode of the control transistor T4, and the first sensing electrode 601 is connected to the voltage signal V2 transmitted by the second reference signal line V2. As shown in FIG. 21, a fourth capacitor C4 is formed between the combination of the first conductive body portion 401S and the second conductive body portion 402S and the second sensing electrode 501S, and a fifth capacitor C5 is formed between the second sensing electrode 501S and the first sensing electrode 601. A capacitance value of the second storage capacitor Cst2 may be substantially equal to a sum of capacitance values of the fourth capacitance C4 and the fifth capacitance C5. In this way, the capacitance value of the second storage capacitor Cst2 may be increased, so that performances of the photosensitive circuit may be improved.

In the embodiments of the present disclosure, a part (i.e., the second sensing electrode 501S) of the fourth conductive film layer 50 in a photosensitive circuit region covers parts of the first conductive film layer 10, the semiconductor film layer 20, the second conductive film layer 30, the third conductive film layer 40 and other film layers located below the fourth conductive film layer 50 in the photosensitive circuit region. In this way, the second sensing electrode 501S may protect the film layers, thereby avoiding a damage to the film layers caused by a subsequent PIN structure forming process.

Referring to FIG. 1B, FIG. 19A and FIG. 19B, an orthographic projection of the light-emitting element D1 on the substrate 100 at least partially overlaps an orthographic projection of the photosensitive element OP on the substrate 100. Specifically, the first electrode 701 included in the sixth conductive film layer 70, the pixel defining layer 702, the light-emitting material layer EL, and the second electrode 801 included in the seventh conductive film layer 80 all extend to a region where the photosensitive circuit is located. That is, an orthographic projection of each of the first electrode 701 included in the sixth conductive film layer 70, the pixel defining layer 702, the light-emitting material layer EL, and the second electrode 801 included in the seventh conductive film layer 80 on the substrate 100 at least partially overlaps an orthographic projection of each film layer (i.e., each of the first sensing electrode 601, the second sensing electrode and the photosensitive layer OPL) included in the photosensitive element OP on the substrate 100. In this way, light emitted by the light-emitting element D1 may be sensed by the photosensitive element OP.

Optionally, in the region where the photosensitive circuit is located, the sixth conductive film layer 70 may include the first electrode 701 of the above-mentioned light-emitting element and a first sensing electrode lead-out portion 710. The first electrode 701 is spaced apart from the first sensing electrode lead-out portion 710, for example, a part of the pixel defining layer 702 may be disposed in a gap between the first electrode 701 and the first sensing electrode lead-out portion 710, so as to electrically isolate the first electrode 701 and the first sensing electrode lead-out portion 710.

For example, the fifth conductive via hole VAH5 exposes at least a part of the first sensing electrode 601. The fifth conductive via hole VAH5 may penetrate through an insulating layer between the fifth conductive film layer 60 and the sixth conductive film layer 70. Orthographic projections of the first sensing electrode lead-out portion 710, the fifth conductive via hole VAH5 and the first sensing electrode 601 on the substrate 100 at least partially overlap each other. In this way, the first sensing electrode 601 may be electrically connected to the first sensing electrode lead-out portion 710 through the fifth conductive via hole VAH5. Then, the first sensing electrode lead-out portion 710 may be electrically connected to the second reference signal line V2. In this way, the first sensing electrode 601 may be electrically connected to the second reference signal line V2, that is, the first sensing electrode 601 is connected to the voltage signal V2 transmitted by the second reference signal line V2.

It should be noted that, in the above-mentioned embodiments, structures of each film layer located in a region where the pixel drive circuit is located and in a region where the photosensitive circuit is located are respectively described. It should be understood that film layers including the above-mentioned semiconductor film layer, each conductive film layer, and each insulating film layer may exist both in the region where the pixel drive circuit is located, and in the region where the photosensitive circuit is located. For example, the first light shielding portion SHL1 and the second light shielding portion SHL2 are both located in the same first conductive film layer 10, active layers of the transistors T1, T2, T3 of the pixel drive circuit and the transistor T4 of the photosensitive circuit are all located in the same semiconductor film layer 20, and the gate electrodes thereof are all located in the same second conductive film layer 30.

It should also be noted that, the second switch transistor T2 and the third switch transistor T3 have low requirements for a drift of a threshold voltage Vth. In order to save space, neither of the second switch transistor T2 and the third switch transistor T3 uses a light shielding design. That is, a light shielding portion may not be provided under channel regions of the second switch transistor T2 and the third switch transistor T3.

Figure 22:
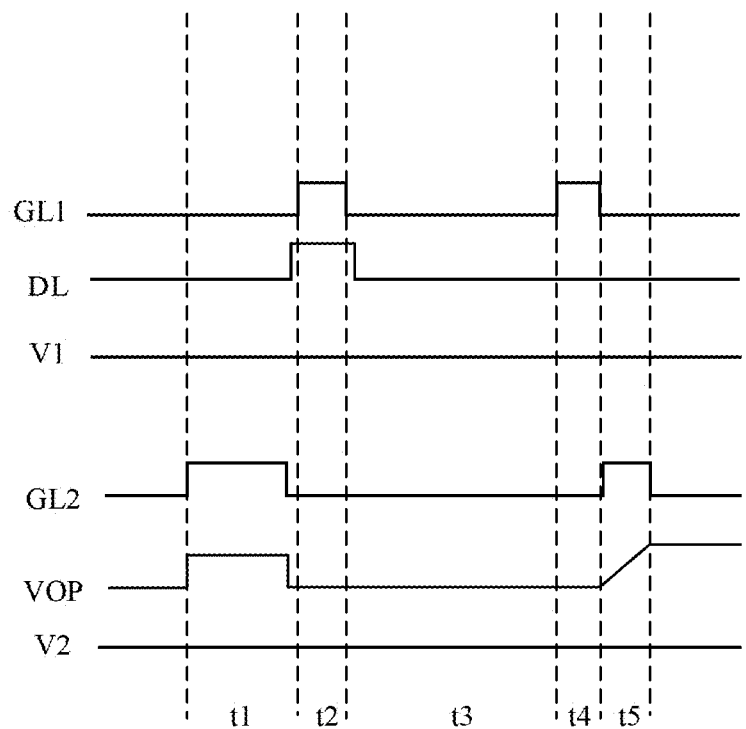
FIG. 22 shows an operation timing diagram of a display substrate according to some exemplary embodiments of the present disclosure.

A working process of the display substrate provided by the embodiments of the present disclosure will be described below by taking the pixel drive circuit shown in FIG. 2 and the photosensitive circuit shown in FIG. 11 as an example. FIG. 22 shows an operation timing diagram of a display substrate according to some exemplary embodiments of the present disclosure. In the following description, the transistors T1 to T4 being all N-type transistors is described as an example. The N-type transistor is turned on when the gate electrode is at a high level, and turned off when the gate electrode is at a low level. However, the embodiments of the present disclosure are not limited thereto. Each transistor in the embodiments of the present disclosure may also be a P-type transistor. The P-type switch transistor is turned on when the gate electrode is at a low level, and turned off when the gate electrode is at a high level.

As shown in FIG. 22, the display substrate provided by the embodiment may perform an optical compensation through the following five working stages.

In the first stage t1 (i.e., a reset stage), the control transistor T4 is turned on under a control of a high level of a signal of the second scan signal line GL2, and the second sensing electrode 501S of the photosensitive element OP is turned on with the detection signal line VOP, so that the second sensing electrode 501S of the photosensitive element OP is loaded with a positive voltage; the second reference signal line V2 may be loaded with a negative voltage (for example, −5V), so that a negative voltage is loaded on the first sensing electrode 601 of the photosensitive element OP, and the photosensitive element OP works in a reverse biased state. In addition, the first switch transistor T2 and the second switch transistor T3 are turned off under a control of a low level of a signal of the first scan signal line GL1.

In the second stage t2 (i.e., an input writing stage), the first switch transistor T2 and the second switch transistor T3 are turned on under a control of a high level of the signal of the first scan signal line GL1; the first switch transistor T2 provides a signal provided by the data line DL to the gate electrode of the drive transistor T1, so that a gate voltage of a drive transistor M1 is a voltage provided by the data line DL and is stored by the first storage capacitor Cst1; the second switch transistor T3 provides a reference voltage signal (e.g., 0V) transmitted on the first reference signal line V1 to the light-emitting element D1, and a voltage value of the reference voltage signal is smaller than that of a signal at the second power supply terminal VSS, so that the light-emitting element D1 is in a reverse bias state. In addition, the control transistor T4 is turned off under a control of a low level of the signal of the first scan signal line GL2.

In the third stage t3 (i.e., a display stage), the first switch transistor T2 and the second switch transistor T3 are turned off under the control of the low level of the signal of the first scan signal line GL1, and the control transistor T4 is turned off under the control of the low level of the signal of the first scan signal line GL2. The drive transistor T1 generates a drive current under a common control of a gate electrode voltage and a source electrode voltage of the drive transistor T1.

At this stage, the drive current generated by the drive transistor T1 may drive the light-emitting element D1 to emit light, so that the photosensitive element OP may receive the light emitted by the light-emitting element D1 and convert the received light into a current, so that a voltage of the second sensing electrode of the photosensitive element OP may change.

In the fourth stage t4 (i.e., a display off stage), the first switch transistor T2 and the second switch transistor T3 are turned on under the control of the high level of the signal of the first scan signal line GL1; the turned-on first switch transistor T2 provides the signal (data voltage of 0V) provided by the data signal line DL to the gate electrode of the drive transistor T1, and the turned-on second switching transistor T3 provides the reference voltage signal (e.g., 0V) transmitted on the first reference signal line V1 to the light-emitting element D1, so that the light-emitting element D1 stops emitting light, thereby ensuring that the voltage of the second sensing electrode of the photosensitive element OP is stable.

In the previous stage, the voltage of the second sensing electrode has been stored in the second storage capacitor Cst2. The fourth stage may ensure that the photosensitive element OP is not exposed to light for a period of time before the voltage is read out, so that the sensing electrical signal is more accurate.

In the fifth stage t5 (i.e., an optical detection stage), the control transistor T4 is turned on under the control of the high level of the signal of the second scan signal line GL2, so as to tur on the photosensitive element OP and the detection signal line VOP, so that a sensing electrical signal of the photosensitive element OP is transmitted to the detection signal line VOP. A sensing electrical signal on the detection signal line VOP is acquired by the control IC for analysis and compensation calculation, so as to adjust a signal transmitted on the data line DL and improve a display effect of the display substrate.

Optionally, the embodiments of the present disclosure further provide a display device, and the display device may include the above-mentioned display substrate. The display device may include but is not limited to: an electronic paper, a mobile phone, a tablet computer, a television, a monitor, a notebook computer, a digital photo frame, a navigator, and any other products or components with a display function. It should be understood that the display device has the same beneficial effect as the display substrate provided by the above-mentioned embodiments.

Although some embodiments of the present general inventive concept have been illustrated and described, those skilled in the art will appreciate that changes may be made to these embodiments without departing from the principle and spirit of the general inventive concept of the present disclosure, and the scope of the present disclosure is defined by the claims and their equivalents.

What is claimed is:

1. A display substrate, comprising:
 a substrate;
 a plurality of pixel units disposed on the substrate, wherein each of the pixel units comprises a plurality of sub-pixels, and each of the sub-pixels comprises a light-emitting element and a pixel drive circuit for driving the light-emitting element;
 a photosensitive circuit disposed on the substrate, wherein the photosensitive circuit is configured to seuse light emitted by at least one of the pixel units; and
 a first conductive film layer disposed on the substrate,
 wherein the pixel drive circuit at least comprises a drive transistor, the drive transistor is electrically connected to the light-emitting element, the drive transistor at least comprises a drive active layer and a gate electrode, the gate electrode of the drive transistor is located in a side of the drive source layer away from the substrate, and an orthographic projection of the gate electrode of the drive transistor on the substrate at least partially overlaps with an orthographic projection of the drive active layer on the substrate;
 wherein the first conductive film layer at least comprises a first light shielding portion, the first light shielding portion is located between the substrate and the drive active layer, and an orthographic projection of the first light shielding portion on the substrate at least partially overlaps with the orthographic projection of the drive active layer on the substrate; and
 wherein the first light shielding portion is electrically connected to the gate electrode of the drive transistor;
 wherein the photosensitive circuit at least comprises a photosensitive element and a control transistor, the control transistor is electrically connected to the photosensitive element, the control transistor at least comprises a control active layer and a gate electrode, the gate electrode of the control transistor is located on a side of the control active layer away from the substrate, and an orthographic projection of the gate electrode of the control transistor on the substrate at least partially overlaps with an orthographic projection of the control active layer on the substrate; the first conductive film layer further comprises a second light shielding portion, the second light shielding portion is located between the substrate and the control active layer, and an orthographic projection of the second light shielding portion on the substrate at least partially overlaps with the orthographic projection of the control active layer on the substrate; and the second light shielding portion is electrically connected to the gate electrode of the control transistor; wherein the control active layer and the drive active layer are both located in a same semiconductor film layer, and the gate electrode of the control transistor and the gate electrode of the drive transistor are both located in a same second conductive film layer; the display substrate further comprises a third conductive film layer disposed on a side of the second conductive film layer away from the substrate, the third conductive film layer at least comprises a first power supply signal line, a first reference signal line, a data line and a first body portion, the first reference signal line is located between the first power supply signal line and the data line, and the first body portion is located between the first reference signal line and the data line; and the first light shielding portion is electrically connected to the first body portion, and the gate electrode of the drive transistor is electrically connected to the first body portion, so that the first light shielding portion is electrically connected to the gate electrode of the drive transistor.

2. The display substrate according to claim 1, wherein the pixel drive circuit further comprises a first switch transistor, the first switch transistor at least comprises a first electrode and a second electrode, the first electrode of the first switch transistor is electrically connected to the data line, and the second electrode of the first switch transistor is electrically connected to the first body portion.

3. The display substrate according to claim 2, wherein the first conductive film layer further comprises a first conductive portion, and the first conductive portion and the first light shielding portion are integrally connected;
 the display substrate further comprises a first via hole exposing at least a part of the first conductive portion, and orthographic projections of the first body portion, the first via hole and the first conductive portion on the substrate at least partially overlap each other, so that the first conductive portion is electrically connected to the first body portion through the first via hole; and
 the display substrate further comprises a second via hole exposing at least a part of the second electrode of the first switch transistor, orthographic projections of the first body portion, the second via hole and the second electrode of the first switch transistor on the substrate at least partially overlap each other, so that the first body portion is electrically connected to the second electrode of the first switch transistor through the second via hole.

4. The display substrate according to claim 3, wherein the second conductive film layer comprises a first scan signal line and a drive gate electrode portion, the first scan signal line is spaced apart from the drive gate electrode portion, and a part of the drive gate electrode portion overlapping the drive active layer forms the gate electrode of the drive transistor; and the display substrate further comprises a third via hole exposing at least a part of the drive gate electrode portion, and orthographic projections of the drive gate electrode portion, the third via hole and the first body portion on the substrate at least partially overlap each other, so that the drive gate electrode portion is electrically connected to the first body portion through the third via hole.

5. The display substrate according to claim 3, wherein the second conductive film layer further comprises a second scan signal line and a second reference signal line, and a part of the second scan signal line overlapping the control active layer forms the gate electrode of the control transistor;

the display substrate further comprises a first conductive via hole and a second conductive via hole, the first conductive via hole exposes at least a part of the second light shielding portion, and the second conductive via hole exposes at least a part of the second scan signal line;

the third conductive film layer further comprises a first conductive connection portion, and orthographic projections of the first conductive connection portion, the first conductive via hole and the second light shielding portion on the substrate at least partially overlap each other, so that the second light shielding portion is electrically connected to an end of the first conductive connection portion through the first conductive via hole; and orthographic projections of the first conductive connection portion, the second conductive via hole, and the second scan signal line on the substrate at least partially overlap each other, so that the second scan signal line is electrically connected to the other end of the second conductive connection portion through the second conductive via hole.

6. The display substrate according to claim 2, wherein the second conductive film layer comprises a first scan signal line and a drive gate electrode portion, the first scan signal line is spaced apart from the drive gate electrode portion, and a part of the drive gate electrode portion overlapping the drive active layer forms the gate electrode of the drive transistor; and the display substrate further comprises a third via hole exposing at least a part of the drive gate electrode portion, and orthographic projections of the drive gate electrode portion, the third via hole and the first body portion on the substrate at least partially overlap each other, so that the drive gate electrode portion is electrically connected to the first body portion through the third via hole.

7. The display substrate according to claim 2, wherein the second conductive film layer further comprises a second scan signal line and a second reference signal line, and a part of the second scan signal line overlapping the control active layer forms the gate electrode of the control transistor;

the display substrate further comprises a first conductive via hole and a second conductive via hole, the first conductive via hole exposes at least a part of the second light shielding portion, and the second conductive via hole exposes at least a part of the second scan signal line;

the third conductive film layer further comprises a first conductive connection portion, and orthographic projections of the first conductive connection portion, the first conductive via hole and the second light shielding portion on the substrate at least partially overlap each other, so that the second light shielding portion is electrically connected to an end of the first conductive connection portion through the first conductive via hole; and orthographic projections of the first conductive connection portion, the second conductive via hole, and the second scan signal line on the substrate at least partially overlap each other, so that the second scan signal line is electrically connected to the other end of the second conductive connection portion through the second conductive via hole.

8. The display substrate according to claim 2, wherein the display substrate further comprises a fourth conductive film layer disposed on a side of the third conductive film layer away from the substrate, and the fourth conductive film layer at least comprises a second body portion; and an orthographic projection of the second body portion on the substrate at least partially overlaps with an orthographic projection of the drive transistor on the substrate, and the second body portion is electrically connected to the gate electrode of the drive transistor.

9. The display substrate according to claim 3, wherein the second conductive film layer comprises a first scan signal line and a drive gate electrode portion, the first scan signal line is spaced apart from the drive gate electrode portion, and a part of the drive gate electrode portion overlapping the drive active layer forms the gate electrode of the drive transistor; and the display substrate further comprises a third via hole exposing at least a part of the drive gate electrode portion, and orthographic projections of the drive gate electrode portion, the third via hole and the first body portion on the substrate at least partially overlap each other, so that the drive gate electrode portion is electrically connected to the first body portion through the third via hole.

10. The display substrate according to claim 1, wherein the second conductive film layer further comprises a second scan signal line and a second reference signal line, and a part of the second scan signal line overlapping the control active layer forms the gate electrode of the control transistor;

the display substrate further comprises a first conductive via hole and a second conductive via hole, the first conductive via hole exposes at least a part of the second light shielding portion, and the second conductive via hole exposes at least a part of the second scan signal line;

the third conductive film layer further comprises a first conductive connection portion, and orthographic projections of the first conductive connection portion, the first conductive via hole and the second light shielding portion on the substrate at least partially overlap each other, so that the second light shielding portion is electrically connected to an end of the first conductive connection portion through the first conductive via hole; and orthographic projections of the first conductive connection portion, the second conductive via hole, and the second scan signal line on the substrate at least partially overlap each other, so that the second sean signal line is electrically connected to other end of the second conductive connection portion through the second conductive via hole.

11. The display substrate according to claim 9, wherein the third conductive film layer further comprises a first conductive body portion and a second conductive body portion, the first conductive body portion is spaced apart from the second conductive body portion, and the first conductive body portion and the second conductive body portion are respectively electrically connected to the second reference signal line.

12. The display substrate according to claim 11, wherein the control transistor further comprises a first electrode and a second electrode, and the third conductive film layer further comprises a detection signal line;
- the photosensitive element comprises a first sensing electrode, a second sensing electrode, and a photosensitive layer disposed between the first sensing electrode and the second sensing electrode, and the second sensing electrode is located in the fourth conductive film layer;
- the first electrode of the control transistor is electrically connected to the detection signal line, and the first electrode of the control transistor is electrically connected to the second sensing electrode;
- the display substrate further comprises a fifth conductive film layer disposed on a side of the fourth conductive film layer away from the substrate, the first sensing electrode is located in the fifth conductive film layer, and the first sensing electrode is electrically connected to the second reference signal line;
- the photosensitive circuit further comprises a second storage capacitor, and the second storage capacitor is connected in parallel with the photosensitive element;
- orthographic projections of a combination of the first conductive body portion and the second conductive body portion, the second sensing electrode and the first sensing electrode on the substrate at least partially overlap each other; and
- a fourth capacitor is formed between the second sensing electrode and the combination of the first conductive body portion and the second conductive body portion, a fifth capacitor is formed between the second sensing electrode and the first sensing electrode, and a capacitance value of the second storage capacitor is equal to a sum of capacitance values of the fourth capacitor and the fifth capacitor;
- the display substrate further comprises a first sensing electrode lead-out portion, and the first sensing electrode lead-out portion and the first electrode of the light-emitting element are located on a same layer and spaced apart from each other; and
- the first sensing electrode is electrically connected to the second reference signal line through the first sensing electrode lead-out portion.

13. The display substrate according to claim 3, wherein the display substrate further comprises a fourth conductive film layer disposed on a side of the third conductive film layer away from the substrate, and the fourth conductive film layer at least comprises a second body portion; and
- an orthographic projection of the second body portion on the substrate at least partially overlaps with an orthographic projection of the drive transistor on the substrate, and the second body portion is electrically connected to the gate electrode of the drive transistor.

14. The display substrate according to claim 1, wherein at least two pixel units share a same photosensitive circuit.

15. The display substrate according to claim 13, wherein the pixel drive circuit further comprises a second switch transistor, the second switch transistor at least comprises a gate electrode, a first electrode and a second electrode, the gate electrode of the second switch transistor is electrically connected to the first scan signal line, the first electrode of the second switch transistor is electrically connected to the first reference signal line, and the second electrode of the second switch transistor is electrically connected to the light-emitting element,
- the fourth conductive film layer at least comprises a third body portion, the third body portion is spaced apart from the second body portion; and
- an orthographic projection of the third body portion on the substrate at least partially overlaps with an orthographic projection of a combination of the first switch transistor and the second switch transistor on the substrate, and the third body portion is electrically connected to the first scan signal line.

16. The display substrate according to claim 15, wherein the light-emitting element comprises:
- a first electrode;
- a second electrode disposed on a side of the first electrode away from the substrate; and
- a light-emitting material layer sandwiched between the first electrode of the light- emitting element and the second electrode of the light-emitting element,
- wherein each of the drive transistor and the second switch transistor is electrically connected to the first electrode of the light-emitting element, and the first electrode of the light- emitting element is located on a side of the fourth conductive film layer away from the substrate; and
- the second switch transistor further comprises a second switch active layer, orthographic projections of a combination of the drive active layer and the second switch active layer, the first light shielding portion, the first body portion, the second body portion and the first electrode on the substrate at least partially overlap each other.

17. The display substrate according to claim 16, wherein the pixel drive circuit further comprises a first storage capacitor;
- a first capacitor is formed between the combination of the drive active layer and the second switch active layer and the first light shielding portion, a second capacitor is formed between the combination of the drive active layer and the second switch active layer and the first body portion, and a third capacitor is formed between the second body portion and the first electrode; and
- a capacitance value of the first storage capacitor is equal to a sum of capacitance values of the first capacitor, the second capacitor and the third capacitor.

18. A display device comprising the display substrate according to claim 1.

* * * * *